(12) United States Patent
Hulseman et al.

(10) Patent No.: US 9,908,274 B2
(45) Date of Patent: Mar. 6, 2018

(54) SYSTEM AND METHOD FOR EXTRUDING PARTS HAVING MICROSTRUCTURES

(71) Applicant: Hoowaki, LLC, Pendleton, SC (US)

(72) Inventors: Ralph A. Hulseman, Greenville, SC (US); Andrew H. Cannon, Columbia, SC (US); William P. King, Champaign, IL (US); March Maguire, Clemson, SC (US); Carl Hulseman, Greenville, SC (US)

(73) Assignee: Hoowaki, LLC, Greenville, SC (US)

( * ) Notice: Subject to any disclaimer, the term of this patent is extended or adjusted under 35 U.S.C. 154(b) by 246 days.

(21) Appl. No.: 14/811,523

(22) Filed: Jul. 28, 2015

(65) Prior Publication Data

US 2015/0328815 A1   Nov. 19, 2015

Related U.S. Application Data

(63) Continuation-in-part of application No. 13/404,707, filed on Feb. 24, 2012, now Pat. No. 9,120,670.
(Continued)

(51) Int. Cl.
*B29C 47/00* (2006.01)
*D01D 5/253* (2006.01)
(Continued)

(52) U.S. Cl.
CPC .......... *B29C 47/0014* (2013.01); *B21C 23/00* (2013.01); *B21C 23/06* (2013.01);
(Continued)

(58) Field of Classification Search
CPC ......... Y10T 428/2913; Y10T 428/2922; Y10T 428/2925; Y10T 428/2973–428/2978; D01D 5/253; B01D 69/082; B01D 69/08; B01D 69/084; B01D 69/085; B29C 47/0009; B29C 47/0014; B29C 47/0016; B29C 47/0023; B29C 47/003;
(Continued)

(56) References Cited

U.S. PATENT DOCUMENTS

2013/0183480 A1* 7/2013 Rock ................. D03D 15/0077
428/91
2015/0298379 A1* 10/2015 Hulseman .......... B29C 47/0021
428/141

* cited by examiner

*Primary Examiner* — Frank J Vineis
(74) *Attorney, Agent, or Firm* — McNair Law Firm, P.A.; Douglas W. Kim

(57) ABSTRACT

This invention is directed to a microstructured filament that can be used to make fibers having an extruded filament having pre-cooled microfeatures in a radial spiral arrangement about a bore though the filament wherein the microfeature has a width in the range of 25 μm to 40 μm and height in the range of 90 μm to 100 μm; and, the filament having a post-cooled state having post-cooled microfeatures having physical dimensions smaller than that of the pre-cooled microfeatures. The filament can include microfeatures having a width in the range of 400 nm to 4 μm and height in the range of 400 nm to 4 μm. The filament and fiber can include physical characteristics selected from the group consisting of: hydrophobicity, self-cleaning, increased hydro-dynamic drag coefficients, decreased or increased aerodynamic drag coefficients, increased friction, reduced friction, optical effects, increased adhesion, decreased adhesion, oleophobicity, tactile effects, anti-blocking and any combination of these.

23 Claims, 26 Drawing Sheets

Related U.S. Application Data

(60) Provisional application No. 61/446,180, filed on Feb. 24, 2011.

(51) Int. Cl.
*B21C 23/08* (2006.01)
*B81C 99/00* (2010.01)
*B29C 47/12* (2006.01)
*B21C 23/00* (2006.01)
*B21C 23/06* (2006.01)
B29L 31/00 (2006.01)
B29K 101/12 (2006.01)
B29C 47/34 (2006.01)
B29C 47/36 (2006.01)
B29C 47/08 (2006.01)

(52) U.S. Cl.
CPC ............ *B21C 23/08* (2013.01); *B29C 47/003* (2013.01); *B29C 47/12* (2013.01); *B81C 99/0015* (2013.01); *D01D 5/253* (2013.01); *B29C 47/0021* (2013.01); *B29C 47/0023* (2013.01); *B29C 47/0066* (2013.01); *B29C 47/0898* (2013.01); *B29C 47/34* (2013.01); *B29C 47/367* (2013.01); *B29C 2793/0027* (2013.01); *B29K 2101/12* (2013.01); *B29K 2995/0074* (2013.01); *B29K 2995/0093* (2013.01); *B29L 2031/731* (2013.01); *B29L 2031/756* (2013.01); *Y10T 428/2978* (2015.01)

(58) Field of Classification Search
CPC .......... B29C 47/0033; B29C 47/8815–47/888; B81C 99/0015; B29L 2031/756–2031/7562; D06M 2200/00–2200/50
USPC .............. 428/364, 369, 371–401; 264/177.1, 264/177.13, 177.16–177.19
See application file for complete search history.

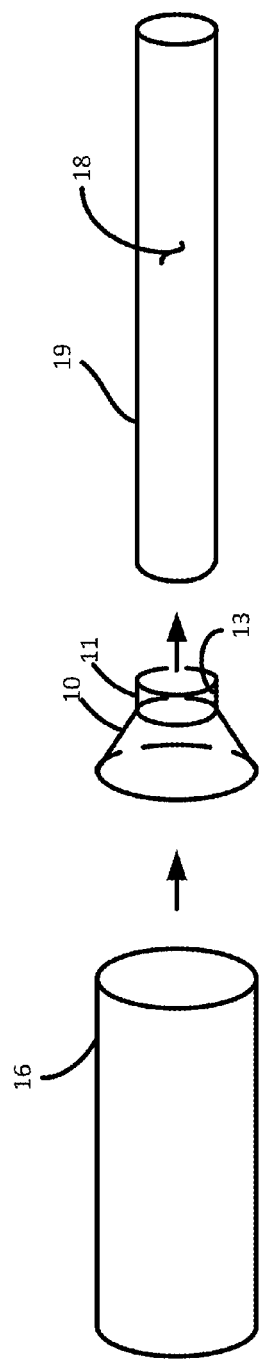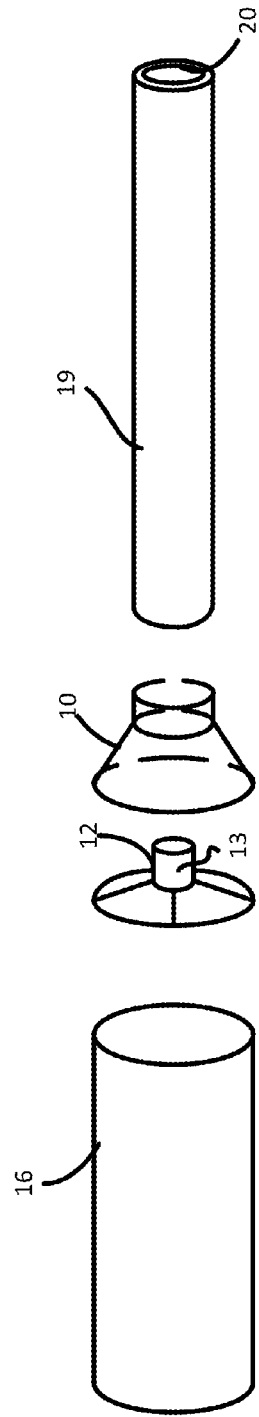

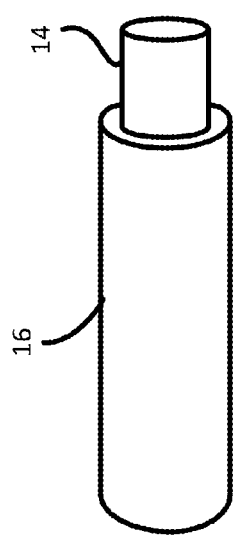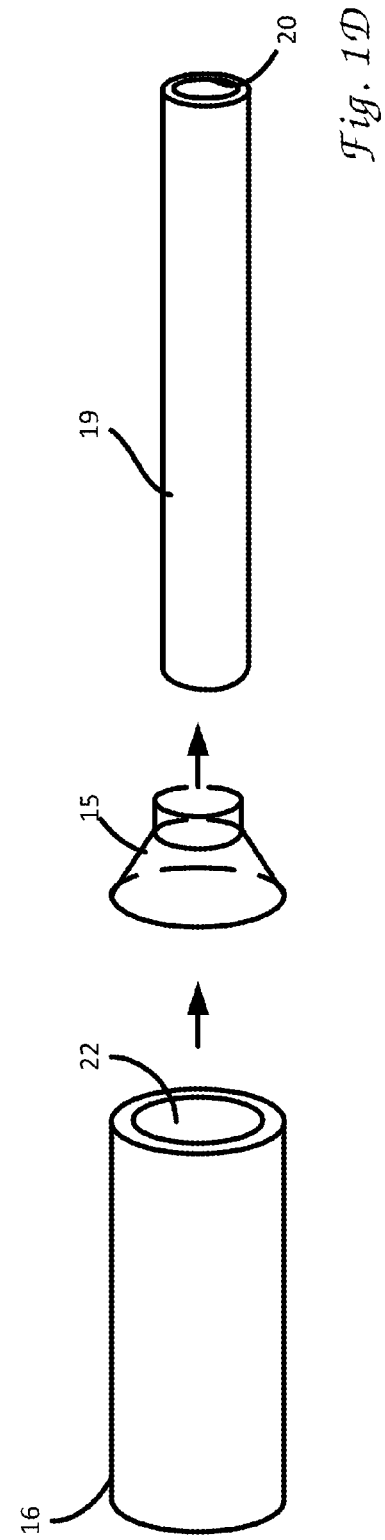

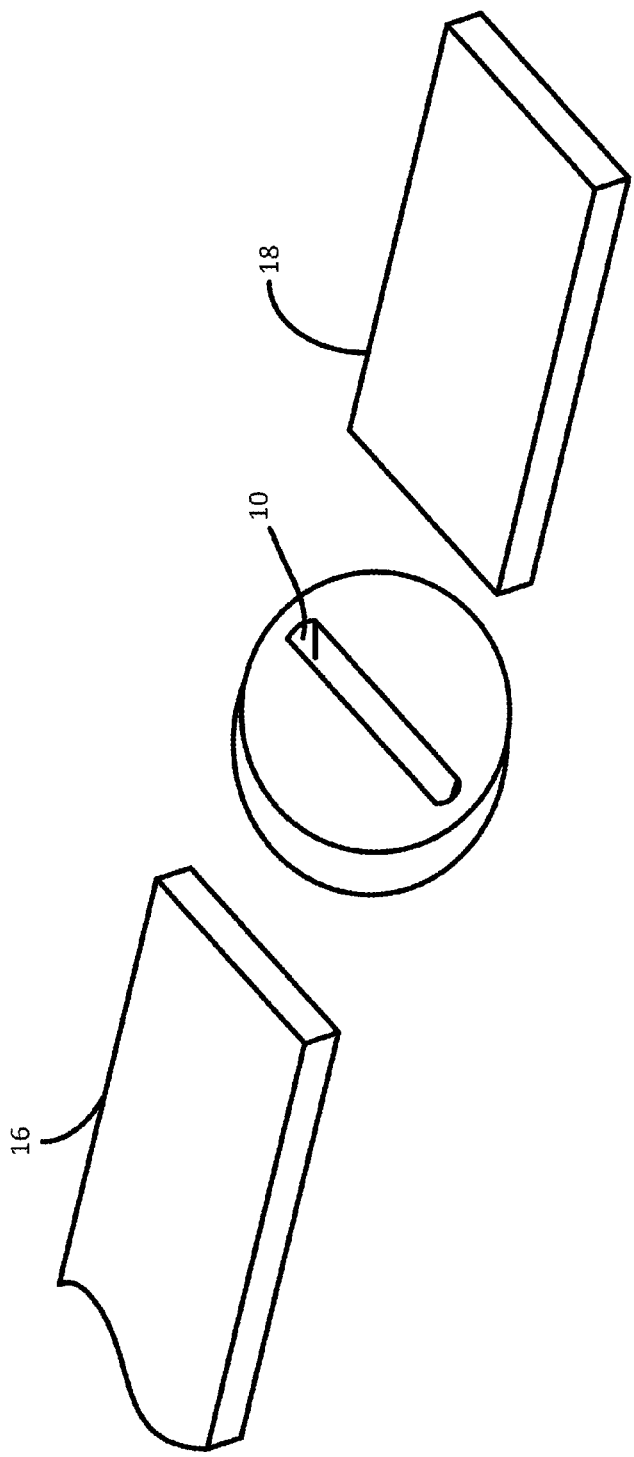

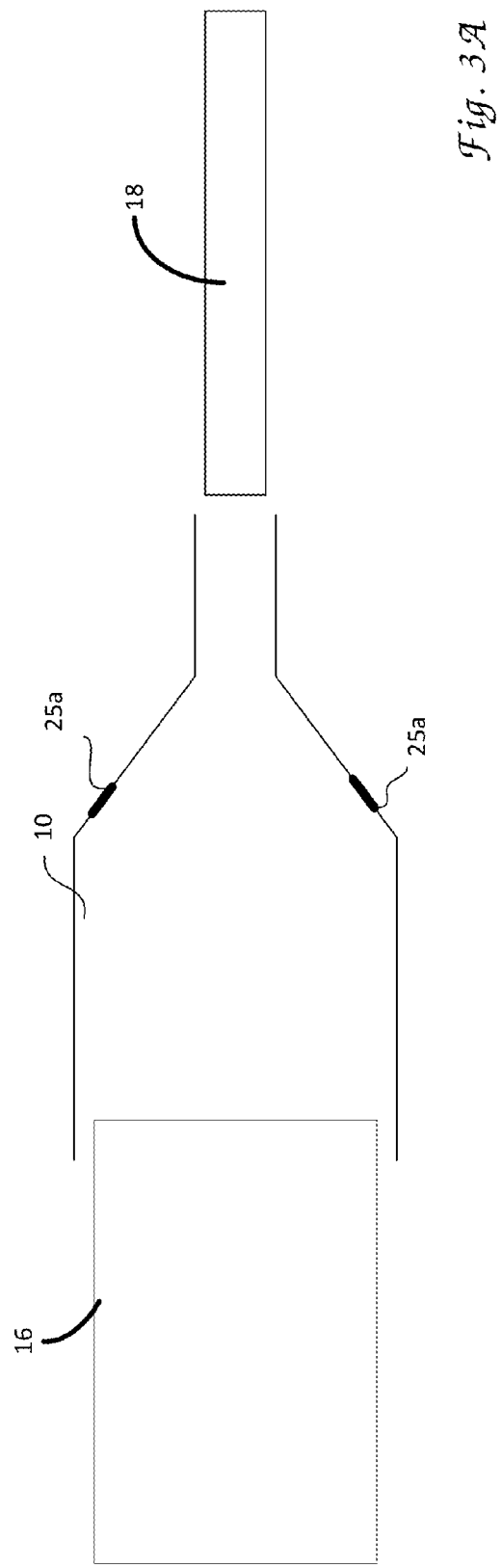

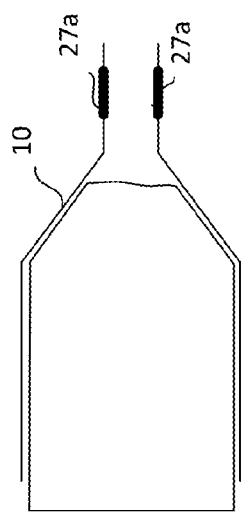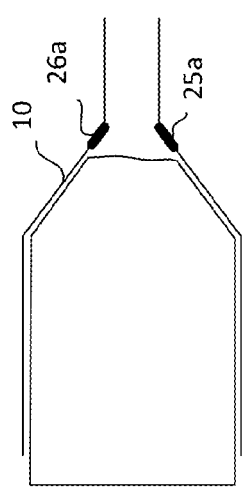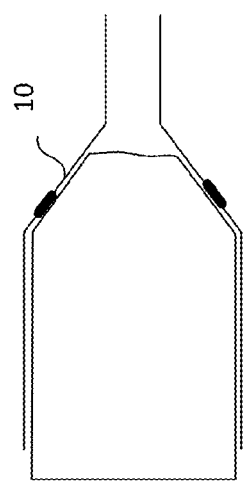
Fig. 3B

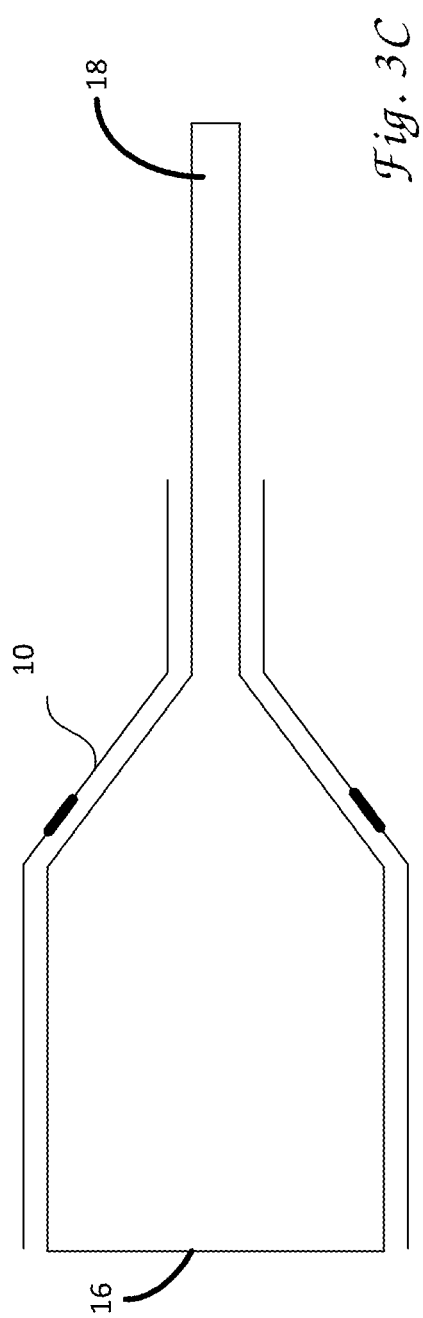

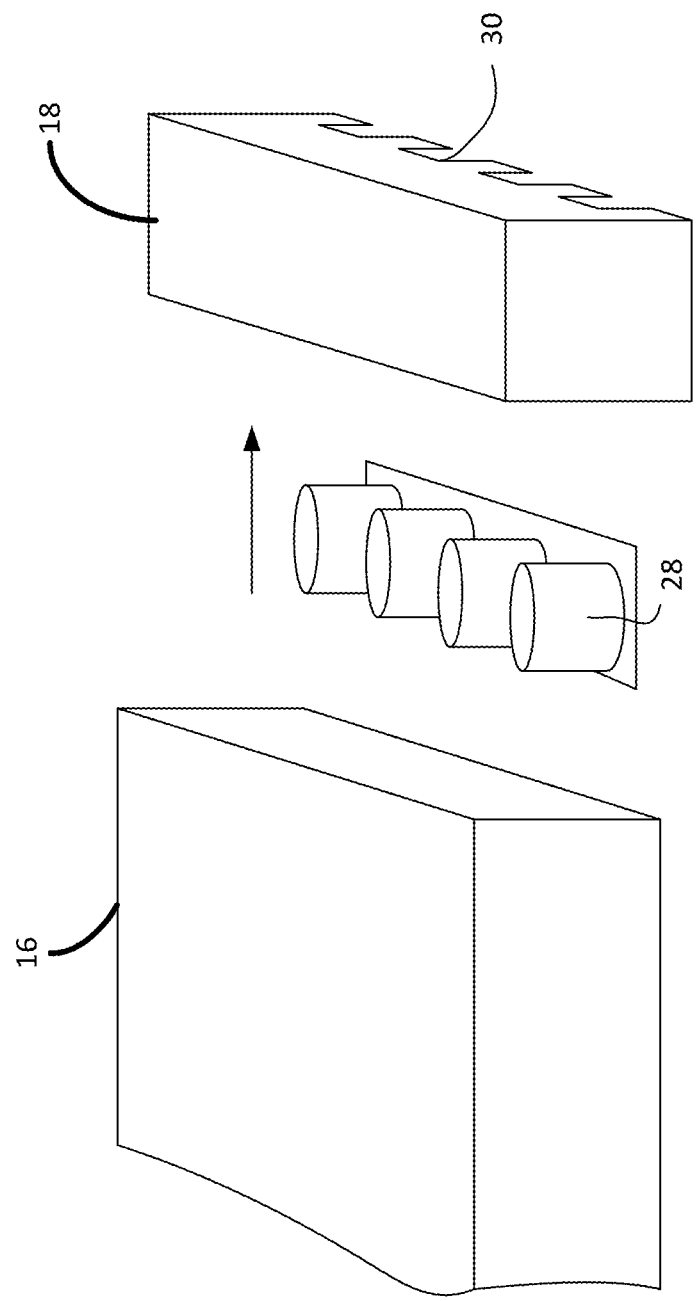

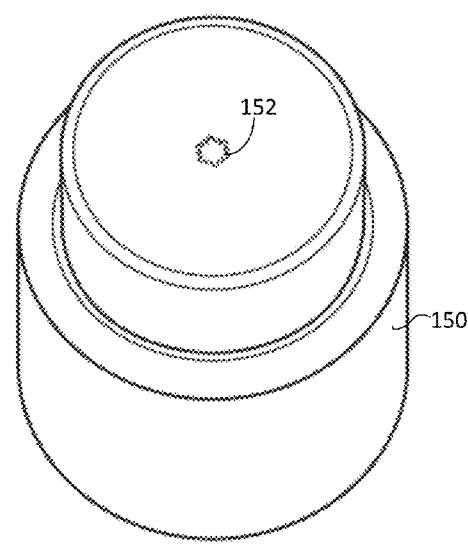
Fig. 15A
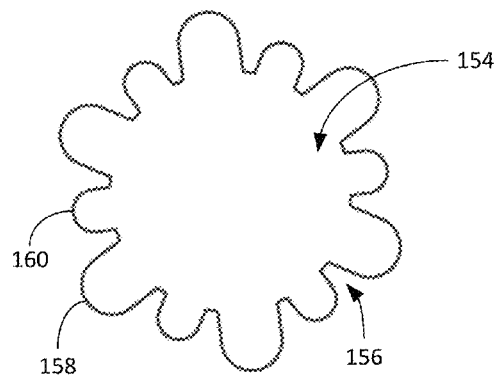
Fig. 15B
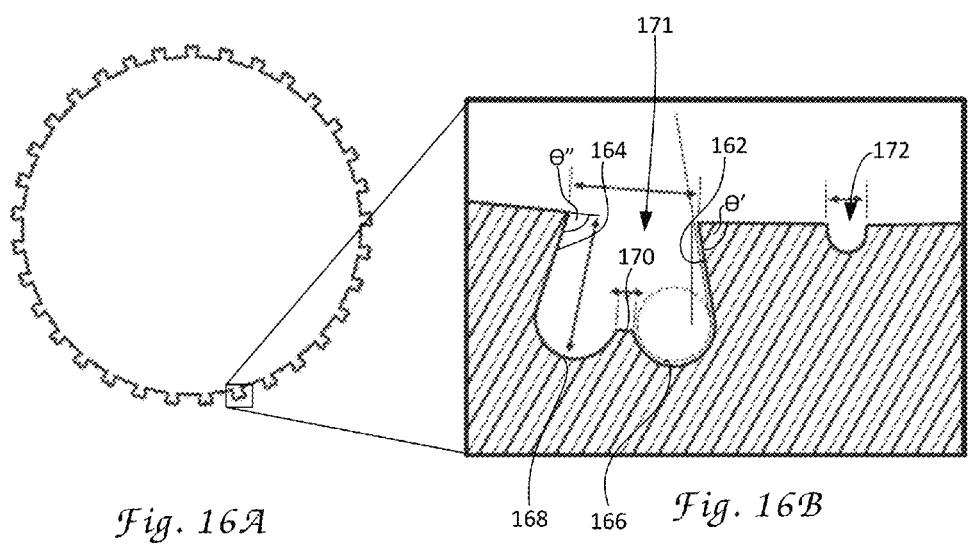
Fig. 16A
Fig. 16B

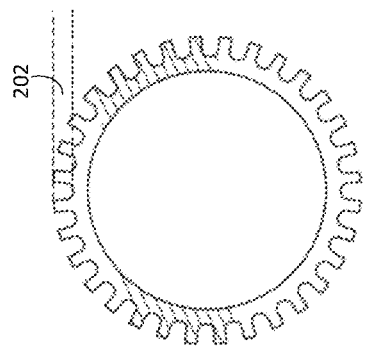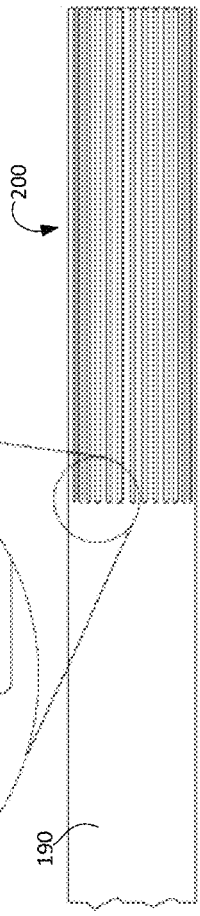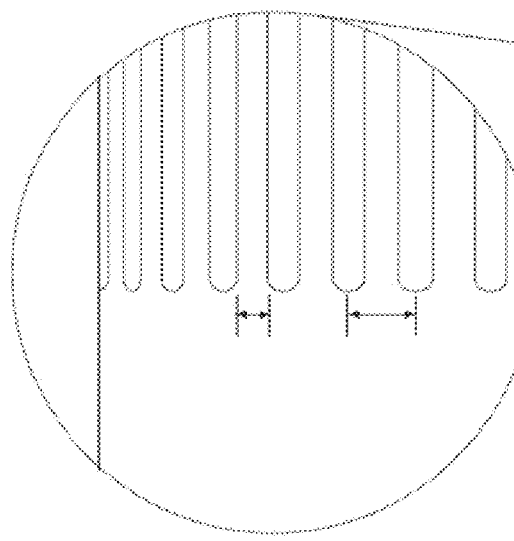

SYSTEM AND METHOD FOR EXTRUDING PARTS HAVING MICROSTRUCTURES

BACKGROUND OF THE INVENTION

1) Field of the Invention

This invention is directed to a system and method of making parts and more specifically, a system and method of making parts using the manufacturing process of extrusion wherein the resulting parts have microstructures imparted on their surface.

2) Description of the Related Art

Extrusion is a manufacturing process that is used to create parts having a fixed cross-sectional profile. Extrusion material is pushed or drawn through an extrusion or drawings die of a desired cross-section. Extrusion can be used with extrusion material that is brittle since the extrusion material only encounters compressive and shear stresses. Extrusion also can produce finished parts with surface finish.

Extrusion may be a continuous process which can theoretically produce indefinitely long parts. In one form, extrusion produces semi-continuous parts resulting in a replication of virtually identical parts or parts having the same cross-section, but varying lengths. The extrusion process can be done with extrusion material that is hot or cold. Commonly extruded materials include metals, polymers, plastics, ceramics, concrete and foodstuffs.

Solid parts can be produced with a simple flat extrusion die. Hollow cavities within parts can be produced with a die having depth, beginning first with a shape profile that supports the center section. The die shape then internally changes along its length into the final shape, with the suspended center pieces supported from the back of the die. Mandrels can also be used to produce extruded parts having cavities.

Parts can also be effected by the drawings process. Drawing is a manufacturing process which uses tensile forces to stretch material. Generally, drawings is described as sheet drawing or wire, bar, and tube drawing. Sheet drawing involves deformation over a curved axis. Wire, bar, and tube drawing pulls material through a drawings die to reduce its diameter and increase its length. Drawing is usually done at room temperature, thus classified a cold working process, however it may be performed at elevated temperatures for hot work large wires, rods or hollow sections in order to reduce forces. Drawings can be used for metals and non-metals.

Under the current state of the art, the extrusion process (which includes drawing), generally produces a surface with a smooth or fine finish. It would be advantageous to be able to impart surface properties onto extrusion material during the extrusion process which results in the parts resulting from the extrusion process having certain physical properties.

Microfeatures placed on a part can provide for advantageous surface properties. By including a plurality of microfeatures on the surface of an object, other characteristics may be imparted to the object, such as increased hydrophobicity, hydrophilicity, self-cleaning ability, hydro-dynamics drag coefficients, aerodynamic drag coefficients, frictional properties, and optical effects. Superhydrophobic surfaces were first inspired by the characteristic water repellency of the lotus leaf.

Historically, microfeatures were applied to surfaces as coating, adhesive or chemical reaction and therefore are prone to wear of the surface. Over time the properties provided by the microstructures are lost. Further, the applications of a coating or adhesive would have to be added to the extrusion process and would not naturally be integrated into the extrusion process.

The information contained in PCT Patent Application: US09/43306, "Method of Manufacturing Microstructures", filed on May 8, 2009; PCT Patent Application: US09/43307, "Flexible Microstructured Superhydrophobic Materials", filed on May 8, 2009 and PCT Patent Application: US09/49565, "Casting Microstructures into Stiff and Durable Materials from a Flexible and Reusable Mold", filed on Jul. 2, 2009 are incorporated by reference.

Additionally, there are attempts to increase the surface area of the fibers by using shapes that include "T", "Y", "Y" with a sphere at each distal end, "Y" with equal length legs, "Y" with rounded distal ends and an combination thereof. While these orifice shapes provide for fibers with increased surface area, they sacrifice strength when compared to a fiber with a circular cross-section.

Therefore, it is an object of this invention to provide an extruded filament using a die and extrusion process that resulted in parts having microfeatures.

It is another object of this invention to provide a filament which results in the filament including microfeatures imparting certain physical properties to the filament even when drawing.

It is another object of this invention to provide a filament that has microfeatures on its surface, such that these microfeatures are imparted on the filament thereby affecting the performance or properties of the filament.

It is another object of this invention to provide a filament with an increased surface area while maintaining generally a circular cross section.

SUMMARY OF THE INVENTION

The objects above are achieved by providing a filament having microstructures comprising: a filament extruded through a die having a pre-cooled state and pre-cooled microstructures; a plurality of microfeatures included in the pre-cooled microstructure each having a width in the range of 25 µm to 40 µm, height in the range of 90 µm to 100 µm and distance between the microfeatures in the range of 50 µm to 60 µm and a short axis in the range of 340 µm to 380 µm; and, the filament having a post-cooled state having post-cooled microfeatures having physical dimensions smaller than that of the pre-cooled microfeatures. An arc portion can be disposed a distal end of the microfeatures. Concave portions can be disposed between a base and the distal end of the microstructures. A first arc can be disposed at a distal end of a die channel included in the die to produce the pre-cooled microstructure on the filament. A second arc can be disposed at the distal end of the die channel included in the die to produce the pre-cooled microstructure on the filament. The first arc can be adjacent to the second arc.

The filament can have generally a circular cross section. A fiber can be provided that comprises a plurality of filaments. The microfeatures can be arranged about the filament in opposite pairs. The microfeatures can include a center line that defines an angle Θ relative to a long axis in the range of 0° to 90°. The angle Θ can be less than 45°.

The invention can include a filament having microstructures comprising: a filament extruded through a die having a pre-cooled state and a pre-cooled microstructure; a plurality of microfeatures included in the pre-cooled microstructure in a radial spiral arrangement about a center that extends through each filament wherein the microfeatures each have a width in the range of 180 µm to 215 µm, height in the range of 170 µm to 180 µm, and short axis in the range of 390 µm to 410; and, the filament includes a post-cooled state having post-cooled microfeatures having physical dimensions smaller than that of the pre-cooled microfeatures. The microfeatures can be arranged in opposite pairs and have a distance between microfeatures in the range of 50 µm to 60 µm. There can be between 6 and 23 microfeatures on each filament. A capped portion can be disposed at a distal end of the microfeature. The capped portion can generally be flat. The capped portion can includes an arc. The microfeatures can include a center line that defines an angle Θ relative to a long axis in the range of 0° to 90°. Angle Θ is less than 45°.

A fiber can be provided that comprises of a plurality of filaments wherein the fiber is gathered on a take-up roller so that filaments of a pre-gathered fiber have larger physical dimensions than that of a post-gathered fiber. The fiber can comprises a plurality of filaments wherein the fiber includes physical characteristics selected from the group consisting of: hydrophobicity, self-cleaning, increased hydro-dynamic drag coefficients, decreased or increased aerodynamic drag coefficients, increased friction, reduced friction, optical effects, increased adhesion, decreased adhesion, oleophobicity, tactile effects, anti-blocking and any combination of these.

The invention can include a filament having microstructures comprising: an extruded filament having pre-cooled microfeatures in a radial spiral arrangement about a center extending though the filament wherein the pre-cooled microfeatures each have widths in the range of 5 µm to 400 µm and heights in the range of 25 µm to 400 µm; and, the filament having a post-cooled state having post-cooled microfeatures having physical dimensions smaller than that of the pre-cooled microfeatures. The pre-cooled microfeatures can each have widths in the range of 180 µm to 215 µm and heights in the range of 90 µm to 180 µm. The microfeatures can each have a width in the range of 25 µm to 40 µm and height in the range of 90 µm to 100.

BRIEF DESCRIPTION OF THE DRAWINGS

The description of the invention will be explained with reference to the following figures:

FIGS. 1A through 1D are perspective views of aspects of the invention;
FIG. 2 is a perspective view of aspects of the invention;
FIG. 3A through 3C are side views of aspects of the invention;
FIG. 4A is a perspective view of aspects of the invention;
FIG. 15A is a perspective of aspects of the invention;
FIG. 15B is a cross section of aspects of the invention;
FIG. 16A is a cross section of aspects of the invention;
FIG. 16B is a elevation of a portion of the aspects of the invention.

FIG. 21A is a side view of an aspect of the invention with an enlargement of a portion of the side view;
FIG. 21B is a cross section of aspects of the invention.

DETAILED DESCRIPTION OF THE INVENTION

Figure 4B:
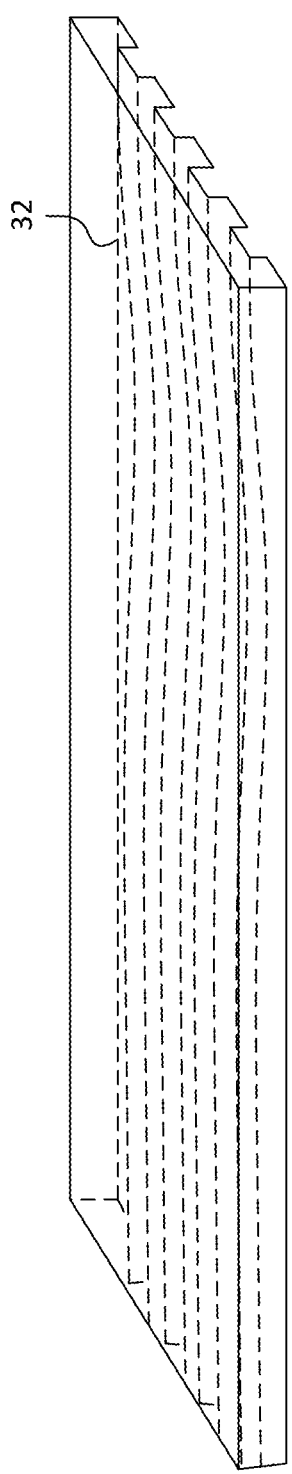
FIG. 4B is a portion of an extrudate resulting from the invention.
Figure 5A:
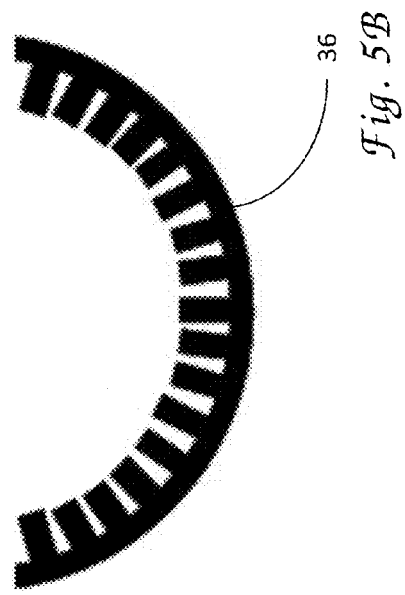
FIG. 5A through 5D are cross sections of portions of extrudate resulting from the invention.
Figure 5B:
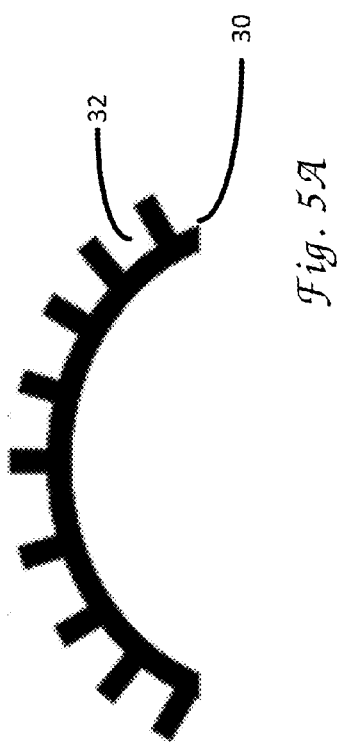
Figure 5C:
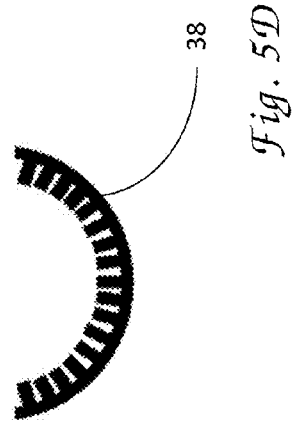
Figure 5D:
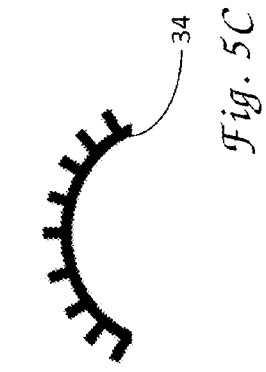

In general, the terms and phrases used herein have their art-recognized meaning, which can be found by reference to standard texts, journal references and contexts known to those skilled in the art. Referring to FIGS. 1A to 1D, extrusion material (also called feed stock, a blank or a billet) 16 is pressed through die 10 resulting in an extruded part 18. The die can be made by a number of manufacturing processes including molding, forming and electric discharging machining.

Microstructures can be imparted to the surface of metal dies with subtractive methods such as direct machining, cutting, or scoring, or laser machining; additive methods such as spraying, coating, or inserts incorporated onto the die surface; and surface alteration methods that neither add nor subtract such as micro molding the metal die surface.

Microstructures can be imparted to the surface of polymer dies with subtractive methods such as direct machining, cutting, or scoring, or laser machining; additive methods such as spraying, coating, or inserts incorporated onto the die surface; and surface alteration methods that neither add nor subtract such as micro molding the metal die surface. Polymer dies can also be molded, and microstructures can be imparted via the mold. A common polymer die material is ultem. The microstructured molded polymer die can be machined after molding.

Microstructures can be imparted to the surface of ceramic dies with subtractive methods such as direct machining, cutting, scoring, or laser machining; additive methods such as spraying, coating, or inserts incorporated onto the die surface. Ceramic dies can also be molded, and microstructures can be imparted via the mold. The microstructured molded ceramic die can be machined after micromolding.

Extrusion dies can be manufactured or have microstructures applied to them as indicated in the PCT application referenced above. Dies can include a single outlet opening or multiple outlet openings. Further, the die can be a single part or an assembly of parts. The die material can be metal, polymer or ceramic. Common die materials include steel, aluminum, and titanium.

Included in the die is an outlet die member 11 having an outlet contact surface 13 forming an outer surface of the resulting part. In one embodiment, the diameter of the blank is reduced though the extrusion process. As shown, die 10 contacts the blank on an outer surface 19 of the resulting part 18. In the event that the resulting part needs to include a cavity, a mandrel 12 can be included in the die which forms the cavity within the blank. Mandrel 12 can include a mandrel contact surface 13 which forms an inner surface 20 of the resulting part. Dies capable of forming extruded parts having cavities include spider dies, porthole dies or bridge dies.

Extrusion material can be metal or non-metal and can include rubber (including natural rubber, styrene-butadiene, polybutadiene, neoprene, ethylene-propylene, butyl, nitrile, silicones), acrylic, nylon, polycarbonate, polyester, polyethylene, polypropylene, polystyrene, polyvinyl chloride, polyolefin and other flexible polymers known to those of skill in the art.

Microstructures are included on the outlet contact surface. Microfeatures can include holes, pillars, steps, ridges, curved regions, recessed regions, raised regions, and any combination of these employing any cross-sectional shape including circles, ellipses, triangles, squares, rectangles, polygons, stars, hexagons, letters, numbers, mathematical symbols and any combination of these.

When the extrusion material comes in contact with microstructures on the die, microstructures are imparted on the surface of the resulting part. These microstructures can increase hydrophobicity to the part, decrease hydrophobicity to the part and/or give the part a self-cleaning ability. The microfeatures can also impart optical effects, for example giving an object a prismatic effect, a specific color, or a directional dependent color change or color flop (e.g. the object appears a specific color when viewed from one angle and another color when viewed from another direction).

The microfeatures can also impart a surface friction or grip to the part, or can give an object a specific tactile sensation such as feeling fuzzy, rough or squishy when touched. In a specific embodiment, the microfeatures can modify the heat transfer characteristics of an object, for example by changing the surface area of an object, changing how the surface interacts with fluids, or changing the behavior of nucleation sites. In a specific embodiment, the microfeatures can result in a decreased heat transfer by conduction, for example when the microfeatures have a high aspect ratio only the tops of the microfeatures will be in contact with another object for conductive heat transfer while the voids between surface features will not transfer heat well. Further, the surface of the resulting part can include microstructures that include "drainage" abilities allowing fluids to drain from the part surface. Further, the microstructures can provide for a capillary action allowing fluid to flow against gravity. Friction can also be modified by particular microstructures imparted to the surface of the results part.

Microstructures can also be electrically conductive, for example metal microstructures or microstructures comprised of an electrically conductive polymers. These types of electrically conductive microstructures are useful, for example, as an array of electrical leads for electronic devices. The electrically conductive microstructures, for example, can be embossed directly onto the surface of an object. In some circumstances, the microstructures on the surface of the extrudate can mirror the microstructures on the die or mandrel. In other circumstances, the microstructures on the extrudate can be of a different size or shape. Extrudate drawing, stretching, or other manipulations can change the shape of the microstructures, for example, shrinking the microstructures down in size by an order of magnitude or more.

In a specific embodiment, the microfeatures have dimensions selected over the range of 10 nm to 1000 µm. In an embodiment, for example, the microfeatures have a length, height, diameter, and/or width selected over the range of 10 nm to 1000 µm, preferably for some embodiments selected over the range of 10 nm to 100 µm. In an embodiment, for example, a pitch between microfeatures is selected over the range of 10 nm to 1000 µm, for some applications selected over the range of 1 µm to 1000 µm, and for some applications selected over the range of 10 µm to 1000 µm.

In one embodiment, the filament can include microfeatures having a width in the range of 25 µm to 40 µm and height in the range of 90 µm to 100 µm. In one embodiment, the filament can include microfeatures having a width in the range of 400 nm to 4 µm and height in the range of 400 nm to 4 µm. The filament diameter after spinning can have a diameter in the range of 15 to 60 microns.

In one embodiment, a preselected pattern of microfeatures includes a region of microfeatures having a first cross sectional shape and a region of microfeatures having a second cross sectional shape, for example different from the first cross sectional shape. In one embodiment, a preselected pattern of microfeatures includes a region of microfeatures having multiple cross sectional shapes and/or sizes. In an embodiment, a preselected pattern of microfeatures refers to two or more arrays of microfeatures of two or more cross-sectional shapes and/or sizes. In a specific embodiment, the two or more arrays are positioned side by side; that is, where the two arrays do not overlap. In another specific embodiment, the two or more arrays are positioned to overlap, and microfeatures having the two or more cross sectional shapes and/or sizes are interspersed within the overlapping arrays.

In an embodiment, a preselected pattern of microfeatures includes multiple dimensions of microfeatures, for example a bimodal or multimodal distribution of dimensions. The size distribution could also be random, or the size could correspond to the location of the microfeature on the mandrel or die. In an exemplary embodiment, a preselected pattern of microfeatures includes a first group of microfeatures having dimensions selected from 10 nm to 1 µm and a second group of microfeatures having dimensions selected from 1 µm to 100 µm. In a specific embodiment, the sizes, shapes and positions of the microfeatures are preselected with micrometer-scale or nanometer-scale accuracy and/or precision.

In an embodiment, the microstructured surface comprises a polymer. Useful polymers include, but are not limited to: PDMS, PMMA, PTFE, FEP, PEEK, polyurethanes, Teflon, polyacrylates, polyarylates, thermoplastics, thermoplastic elastomers, fluoropolymers, biodegradable polymers, polycarbonates, polyethylenes, polyimides, polystyrenes, polyvinyls, polyoelefins, silicones, natural rubbers, synthetic rubbers and any combination of these.

In an embodiment, the microstructured surface comprises a metal. Useful metals include any moldable, castable, embossable and/or stampable metal or alloy. Useful metals include, but are not limited to: aluminum, aluminum alloys, bismuth, bismuth alloys, tin, tin alloys, lead, lead alloys, titanium, titanium alloys, iron, iron alloys, steel, stainless steel, hastelloy, inconel, duranickel, indium, indium alloys, gold, gold alloys, silver, silver alloys, copper, copper alloys, brass, nickel, nickel alloys, platinum, platinum alloys, palladium, palladium alloys, zinc, zinc alloys, cadmium and cadmium alloys.

In one embodiment, the extrusion material 16 can be drawn over an inner die 14. The outer surface of the internal die can have microstructures which cause microstructures to be imparted on the inner surface of the extrusion material. In one embodiment, the extrusion material is a tube with a central cavity.

The extrusion material can be drawn in a manner which will reduce its diameter or its thickness or both after the extrusion material leaves contact with the die. In one embodiment, the extrusion material, having a cavity 22, can be drawn through drawings die 15 which will reduce the diameter of the out perimeter, the bore of the extrusion material or both.

In embodiments, one or more physical, mechanical or optical properties, other than and/or in addition to hydrophobicity, are established, varied and/or controlled by deforming a flexible substrate having a plurality of microfeatures disposed thereon. In an embodiment, for example, an optical property, such as the reflectivity, wavelength distribution of reflected or scattered light, transparency, wavelength distribution of transmitted light, refractive index or any combination of these, is controlled by flexing, bending, expanding, stretching and/or contracting the flexible substrate having a plurality of microfeatures disposed thereon. In an embodiment, a physical property, such as aerodynamic resistance or hydrodynamic resistance is controlled by flexing, bending, expanding, stretching and/or contracting the flexible substrate having a plurality of microfeatures disposed thereon. In an embodiment, a tactile property of the surface, such as the surface's tactile sensation, is controlled by flexing, bending, expanding, stretching and/or contracting the flexible substrate having a plurality of microfeatures disposed thereon.

FIG. 2 illustrates that microstructures can be imparted on a resulting part without necessarily changing the dimension of the resulting part from that of the extrusion material 16. Therefore, the negative microstructures on the die 10 are imparted to the resulting part in generally a 1:1 ratio. When the resulting part dimensions are modified through the extrusion process, the ratio of size between the extrusion material and the resulting part can be up to 7:1 and greater. In one embodiment, shape of the resulting part produced from the die or mandrel can be preserved during the drawing, or the shape can change. The shape preservation or shape change can depend upon the properties of the extrusion material or how the extrusion material is subsequently processed. In one embodiment, the filament includes seven or more nanofeatures or microfeatures where the width of the features when compared to the diameter of the filament is in the range of 1% and 20%.

When the diameter size of the extrusion material is changed after the microstructures are imparted on the resulting part, the microstructures on the part are changed. Therefore, the microstructures contained on the die are larger than that of the resulting microstructures on the resulting part to account for the shrinking of the resulting part from the extrusion material.

When the dimensions of the resulting part change from the extrusion material, one embodiment has the resulting contact angle of the microstructures on the die including in the range of 100 degrees to 120 degrees while the microstructures of the resulting part are between 101 degrees and 170 degrees. When the dimensions of the resulting part change is from the extrusion material, one embodiment has the resulting friction properties of the resulting part being 20 times less than the friction properties of the microstructures on the die. One embodiment has the resulting friction properties of the resulting part being 100 times more than the friction properties of the microstructure on the die. When the dimensions of the resulting part change from the extrusion material, one embodiment has the microstructures on the die on a scale of mm or µm while the microstructures on the resulting part will generally be in the scale of µm or nm.

Referring to FIGS. 3A through 3C, the location of microstructures on the die can vary with the preferred embodiment placing the microstructures at locations 25a (FIG. 3A), 26a or 27a (FIG. 3B) as shown. Referring to FIGS. 4A and 4B, blank 16 can also be extruded with only a portion of the die having a negative of a microstructure shown as 32. When the extrusion material is forced across the die, the shape created by the interaction with the die imparts on the resulting part and can include microstructures 30. The blank can be manufactured into a resulting part 18 through extrusion including drawing the blank through the die.

Referring to FIGS. 5A to 5D, outer surface of a resulting part is shown as 30 having a space 32 between the microstructures. When the extrusion material is drawn down the microstructures on the outer surface are modified, the microstructures themselves and the space between the microstructures is compressed as shown in drawn down resulting part 34. The same effect is realized with microstructures that are on the inner surface of the extrusion material as shown in extrusion inner surface 36 and drawn down extrusion inner surface 38.

Figure 6:
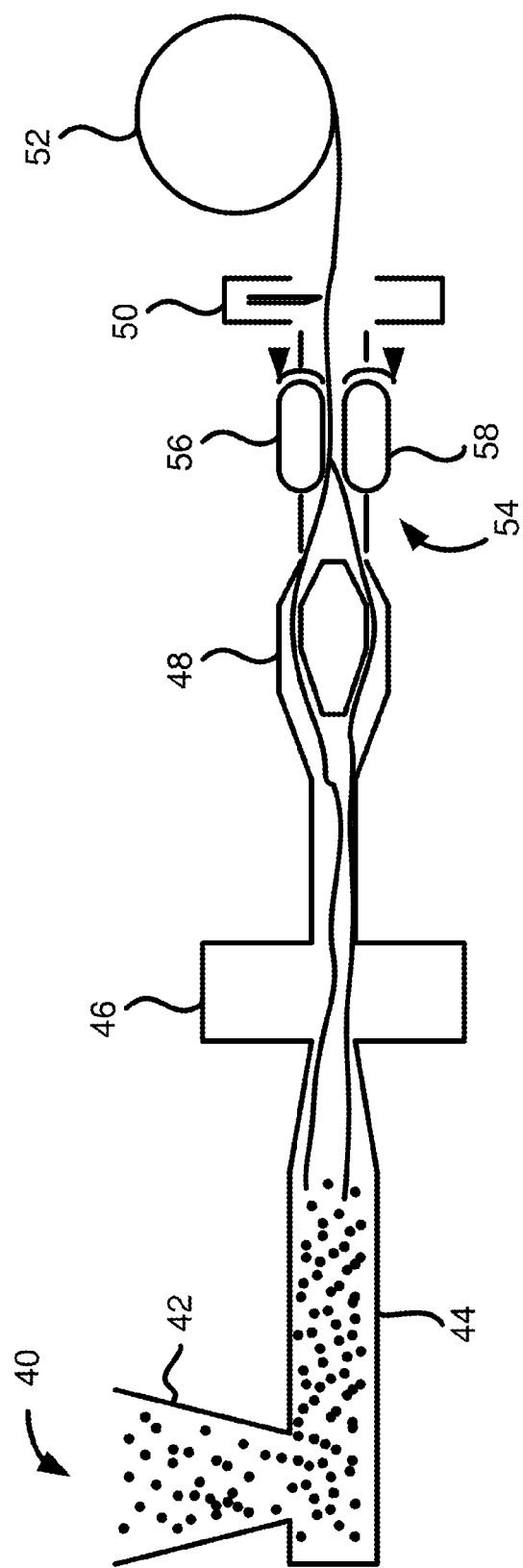
FIG. 6 is a schematic of aspects of the invention.

Referring to FIG. 6, the extrusion process is shown in further detail. Feed stock 40 is placed in hopper 42. The feed stock is then mixed and melted in extrusion chamber 44. The heated feed stock is pumped or otherwise drawn out of the extrusion chamber through a pump or gears 46 and forced through a dye, mandrel or both shown as 48. The extrudate produced by the dye or mandrel, having microstructures, can then be cooled by a cooling assembly 50 such as an air blower or quench bath, cut by cutter 52 or rolled on a spool 54. In the event that the spool rotates at a faster speed then the extrudate exits the die, the extrudate can be drawn to a smaller cross-section dimension.

It should be noted that there can be a plurality of quench baths using various quenching solutions. For example, when extruding aluminum, a quench bath of salt followed by a quench bath of water can be used. The temperature of the quench baths, the time between the extrudate exiting the dye and entering the quench bath and the length of time the extrudate is in the quench bath can vary.

In one embodiment, a puller 54 having an upper belt drive 56 and a lower belt drive 58 pulls the extrudate from the dye and into the cutter or toward the spool. With a puller, the extrudate can be drawn when the pull of the puller is greater than the extrusion rate of the extrudate from the dye. This results in the extrudate being stretched resulting in a smaller diameter extrudate. Additionally, the extrudate can also shrink when the extrudate is quenched and when the extrudate is rolled onto a spool.

Figure 7:
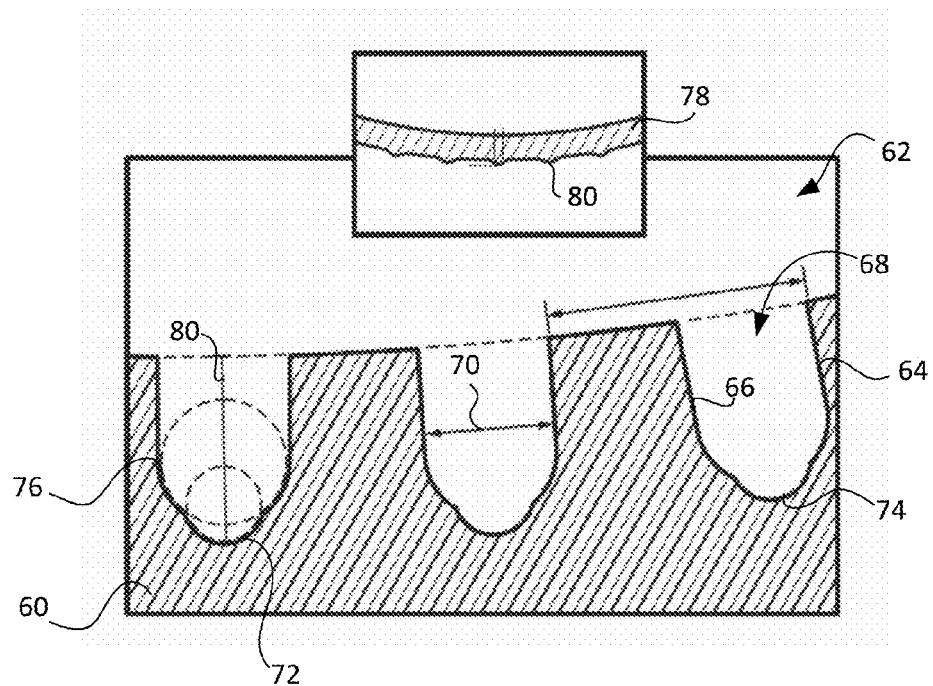
FIGS. 7 through 11 are elevation views of a portion of aspects of the invention.

Referring to FIG. 7, a portion of one microstructure of a circular die is shown. The die 60 includes a plurality of microfeatures 62 each having a first wall 64 and a second wall 66. A channel 68 is defined in the die having a width 70. A first arc 72 can be included in a lower surface 74. A second arc 76 can also be included in the lower surface overlapping the first arc. In use, the die can produce an extrudate 78 having microstructures 80. It should be noted that the extrudate microstructure is not a mirror image of the die microstructures as the extrudate microstructures have physical dimensions as the extrudate cools, is drawn or otherwise physically altered after the leaving the extrusion die. In one embodiment, the radius of the first arc is in the range of 45 to 65 µm. The channel width is in the range of 150 to 250 µm and the height 80 is in the range of 250 to 350 µm. The resulting extrudate microstructures can be between 7 and 13 µm in width and height can have generally a sloped peak configuration.

Figure 8:
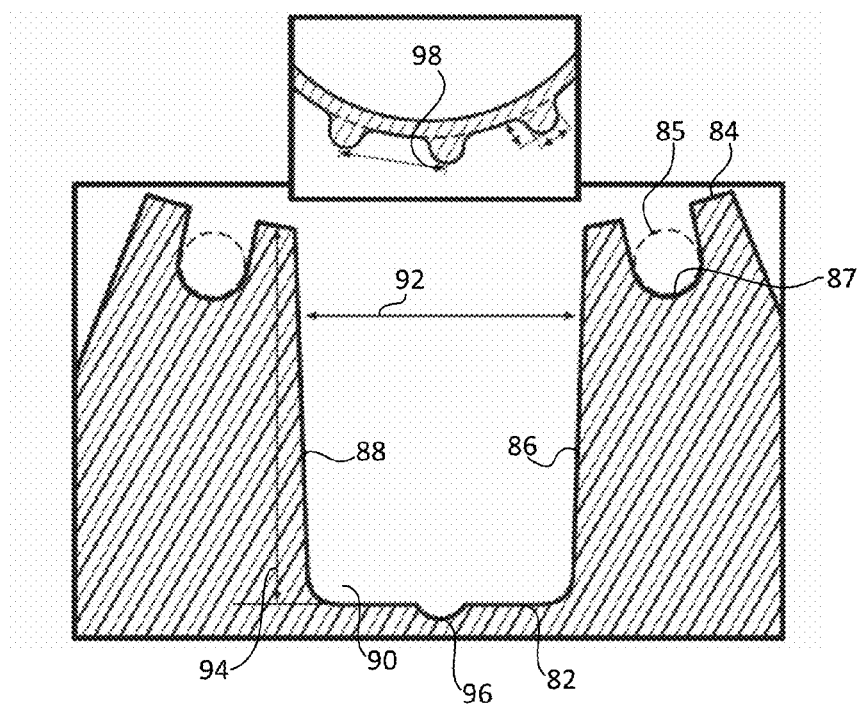

Referring to FIG. 8, another microstructure is shown. A lower surface 82 and a upper surface 84 are included in the die. A first wall 86 and second wall 88 can be included in the microstructure. An upper channel 85 can be defined on the upper surface. The upper channel can include a concave portion 87. A lower channel 90 can be defined in the microstructure having a width 92 and a height 94. An arc 94 can be defined in the lower surface. A second channel or arc 96 can be defined in the lower surface. In one embodiment, the channel height is in the range of 0.8 to 1.6 mm and the height is in the range of 1.0 to 2.0 mm. The resulting microstructures 98 on the extrudate can have a height in the range of 70 to 90 µm, a width in the range of 120 to 160 µm and can also have a general slope shape.

Figure 9:
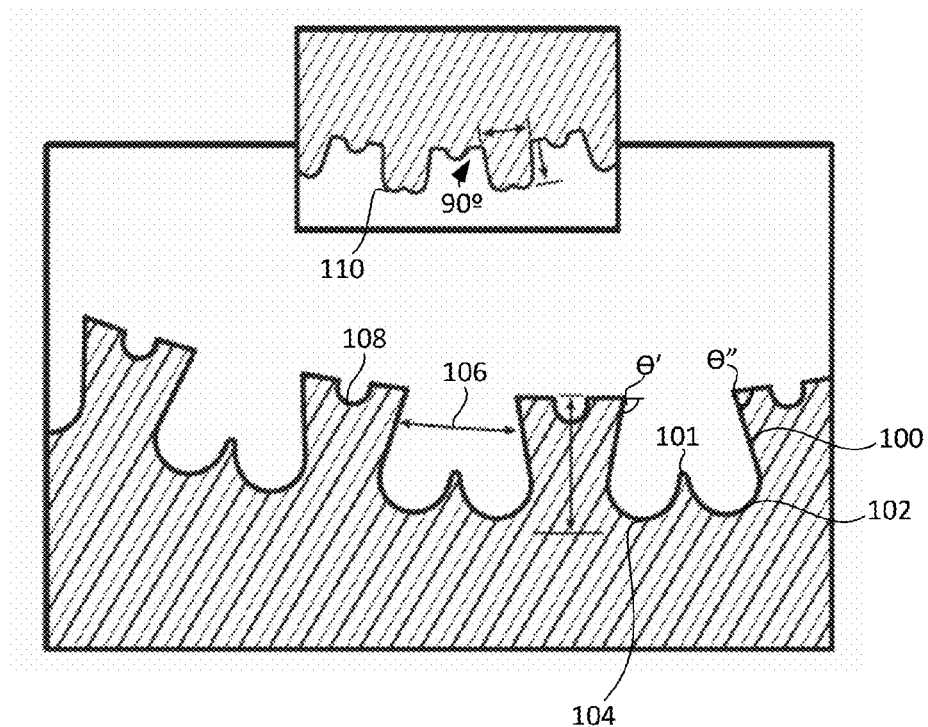

Referring to FIG. 9, another microstructure is shown. A first wall 100 is shown having an angle of incident θ' in relation to the upper surface less than 90° and an angle of incident θ" in relation to the upper surface greater than 90°. A first arc 102 can be included in the lower surface and a second arc 104 can be included in the lower surface adjacent to the first arc. A channel 106 defined in said die can have a width 106 that in one embodiment is in the range of 0.25 to 1.25 mm and a height in the range of 0.25 to 1.25 mm. This arrangement of the first wall, first arc, second arc and second wall is an overhang microstructure. A peak 101 can be disposed between the first and the second arc. During the extrusion process, the extrudate microstructure can shrink through drawings, cooling or other reason resulting in a extrudate microstructure that is generally smaller than the original mirror of the die microstructure. The height of the resulting extrudate microstructure 110 can be in the range of 20 to 60 µm and have a width of between 100 and 140 µm. A upper arc 108 can be included in the upper surface. A wall angle of the extrudate can be at least 90° in relation to the base of the pillar of the microstructure.

Figure 10:
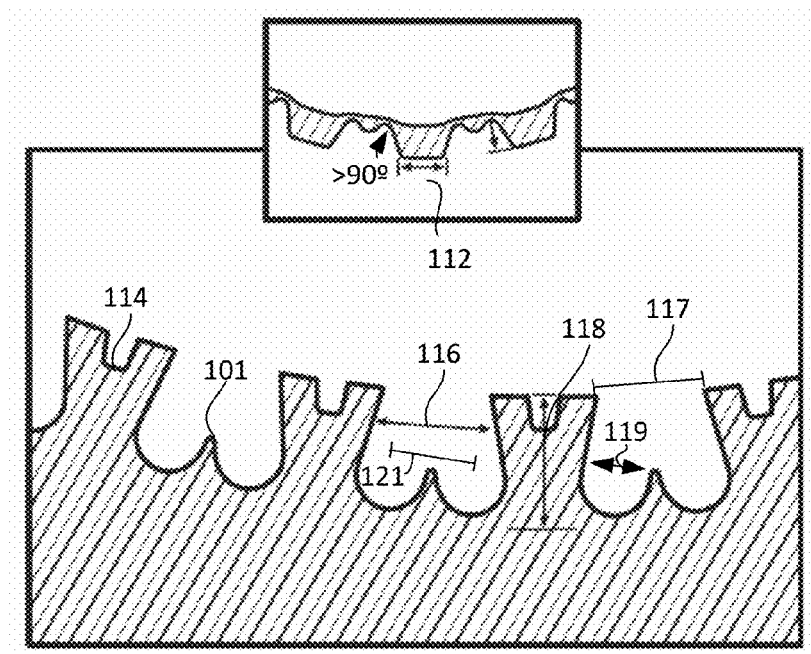

In one embodiment, the sides of the resulting extrudate microstructure are generally vertical. In another embodiment, the walls can be slanted as shown in FIG. 10. The slanted walls can result from a nylon extrudate manufactured with a line speed of 200 feet per second, drawn down about 3.2 times and cooled with a water quench bath. The width 112 of the extrudate can be in the range of 150 to 250 µm and the height can be in the range of 150 to 250 µm. A wall angle of the extrudate can be at least 90° in relation to the base of the pillar of the microstructure. A channel 114 can be included in the upper surface of the die and can have three sides of a generally trapezoidal shape. The resulting extrudate microstructure could be a generally round microfeature included on the extrudate. The microstructure can have a width 116 in the range of 1000 to 1400 µm and a height in the range of 500 to 1000 µm. The resulting extrudate can have a height in the range of 90 to 210 µm and a width in the range of 100 to 380 µm. A wall angle of the extrudate can be at least 90° in relation to the base of the pillar of the microstructure. The distance between base of the microfeature in the channel can be shown as 118 wherein the peak if below the midway point of the depth of the channel. In one embodiment, the opening of the channel 117 is about 60 µm. The channel depth is about 90 µm and the arc width 119 is about 30 µm. The distance from the distal most end of the arcs 121 is about 30 µm in one embodiment. In one embodiment, the opening of the channel is about 30 µm, the channel depth is about 150 µm, the arc width is about 30 µm and distance from the distal most end of the arcs is about 30 µm. In one embodiment, the opening of the channel is about 40 µm, the arc width is about 30 µm and distance from the distal most end of the arcs is about 40 µm. The arc can have a radius of about 61 µm and a radius can be defined between the two arcs that can be about 61 µm. In one embodiment, the opening of the channel is about 30 µm, the channel depth is about 150 µm, the arc width is about 50 µm and distance from the distal most end of the arcs is about 30 µm. The arc can include a flat portion at its distal end and define a radius between the distal end of the arc within the channel. In one embodiment, the opening of the channel is about 20 µm, the channel depth is about 60 µm, the arc width is about 20 µm and distance from the distal most end of the arcs is about 20 µm. The features can number 12, 16 or 22 arranged radially around the inner bore of an orifice of a spinneret. In one embodiment, the bore is about 600 µm. Increasing the number of microfeatures arranged radially around the inner bore allows for an increase in surface area of the filament without sacrificing strength as the circular cross section can be maintained.

Figure 11:
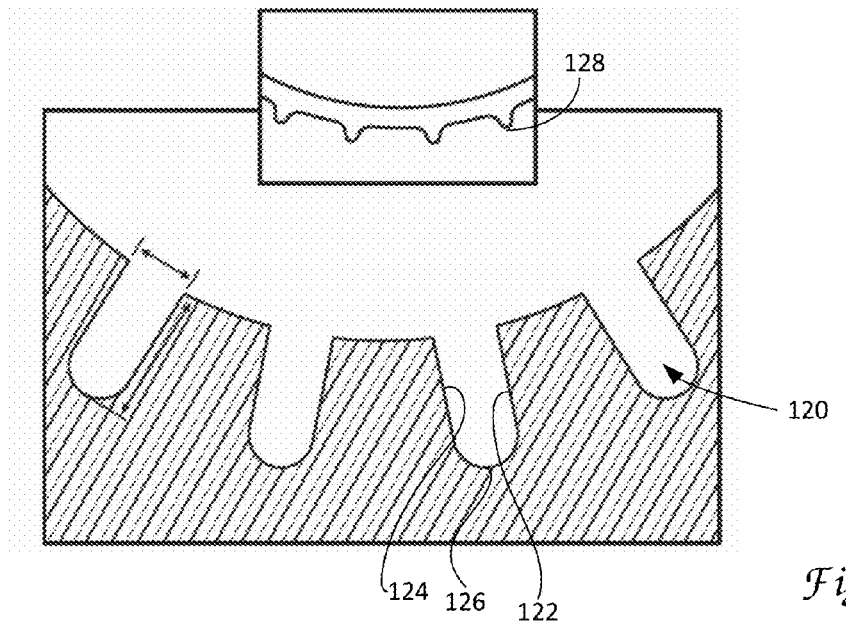

Referring to FIG. 11, a channel 120 can have a first wall 122, a second wall 124 and an arc 126 disposed at the lower surface and between the first and second wall. The channel can have a width in the range of 100 to 140 µm and a height in the range of 200 to 360 µm. The resulting extrudate microstructure 128 can have a height between 45 to 60 µm and a width of 40 to 50 µm.

Figure 12:
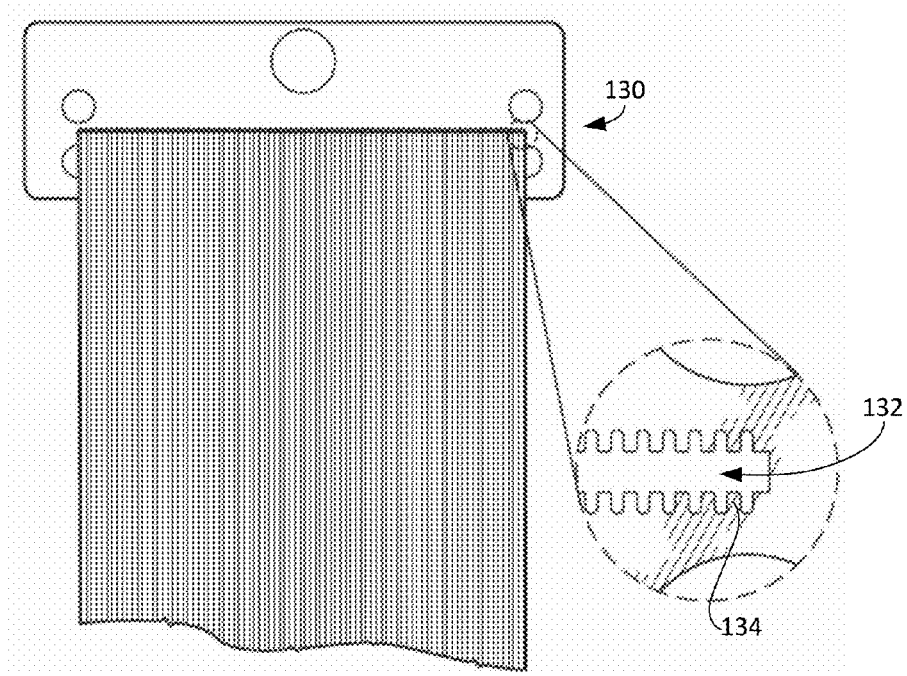
FIG. 12 is a schematic of aspects of the invention.
Figure 13:
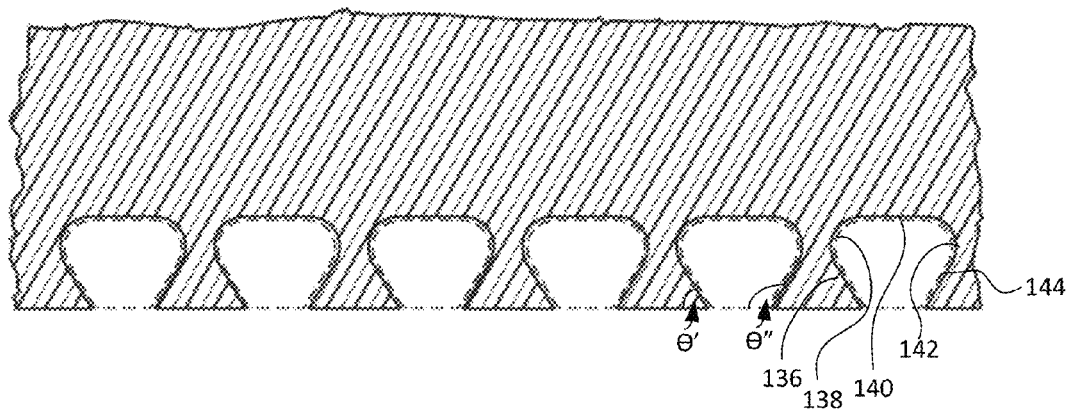
FIG. 13 is an elevation view of a portion of aspects of the invention.
Figure 14:
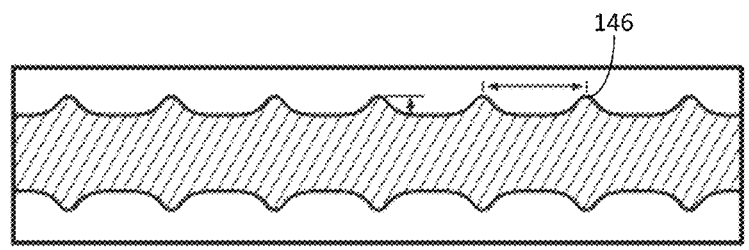
FIG. 14 is a cross section of extrudate resulting from the invention.

Referring to FIGS. 12 and 13, an extrusion die 130 includes an opening 132 having microstructures. As shown, the die is a flat die that can include one or more parts. Microstructures 134 are disposed along the interior surface of the die. In one embodiment, a first wall 136 has an angle of incident θ' that is less than 90°, a first arc 138 adjacent to the first wall, a planar portion 140, a second arc 142 and a second wall 144 having an angle of incident θ" greater than 90°. The resulting extrudate, shown in FIG. 14, is a film or otherwise flat extrudate having microstructures 146 which are generally in the range of 200 to 240 µm apart with a height in the range of 30 to 40 µm.

Referring to FIG. 15A, a circular die 150 is shown having microstructures 152 disposed along an inner surface of the die. Referring to FIG. 15B, one embodiment of the microstructure is shown. Opening 154 is defined in the die with microstructure 156 surrounding the opening. The microstructures define a first arc 158 and a second arc 160 in an alternating pattern wherein the depth of the first arc is greater than the depth of the second arc.

Referring to FIG. 16A, another microstructure for a circular die is shown. The microstructure includes a first wall 162 having an angle of incident θ' in relation to the upper surface of less than 90° and a second wall 164 having an angle of incident θ" in relation to the upper surface of greater than 90°. A first arc 166 disposed at a distal end of the die channel 171 can be included in said microstructure adjacent to a second arc 168 disposed at the distal end of the die channel. A lower planar surface 170 can be included in the microstructure and disposed between the first and second arc. An upper cavity 172 can be included in said upper surface and can be arranged in an alternating pattern in said microstructure.

Figure 17:
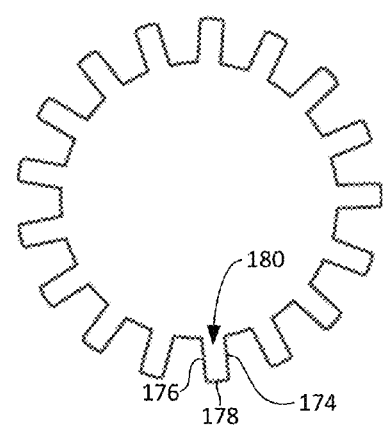
FIG. 17 is a cross section of aspects of the invention.
Figure 18:
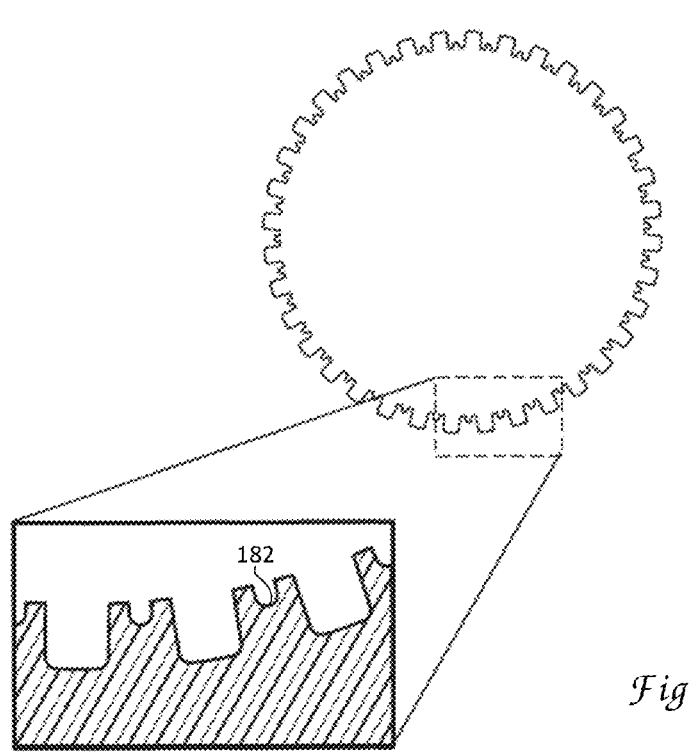
FIGS. 18 through 20 are cross sections and enlargements of portions of the cross sections of aspects of the invention.
Figure 19:
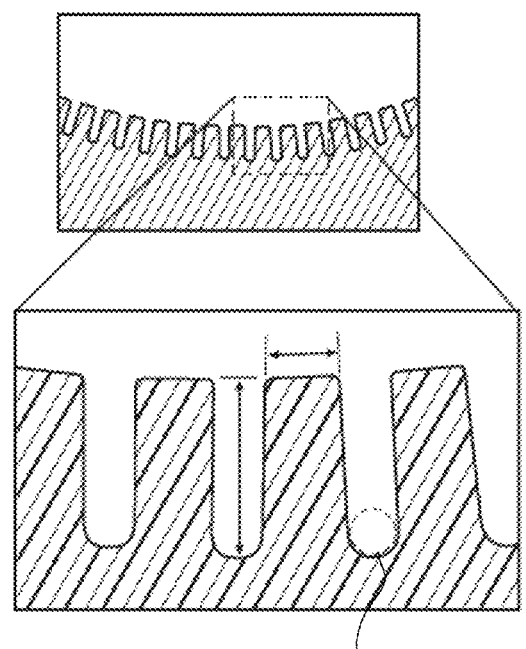

Referring to FIG. 17, another microstructure for a circular die is shown having a first wall 174 and a second wall 176 defining a cavity 180 having a lower planar surface 178. In one embodiment, the first and second wall have a height in the range of 400 to 480 µm and a width in the range of 360 to 380 µm. FIG. 18 shows a upper arc 182 defined in the upper surface. In one embodiment, the upper arc has a width in the range of 100 to 160 µm and a depth in the range of 100 to 160 µm. FIG. 19 shows a lower arc 184 defined in the lower surface.

Figure 20:
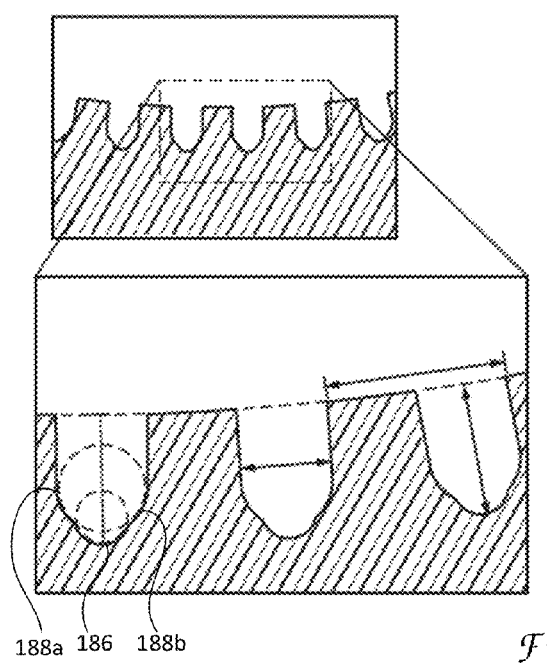

Referring to FIG. 20, another microstructure is shown having a first wall and a second wall defining a cavity. A first arc 186 is defined in the lower surface and in the cavity. A pair of arcs 188a and 188b are defined in the walls of the cavity.

FIG. 21A shows a mandrel 190 having microstructures 200 so that an extrudate made using the mandrel would have microstructures formed on the inner surface of the extrudate. FIG. 21B shows that the microstructures of the mandrel have a height 202.

Figures 22A, 22B:
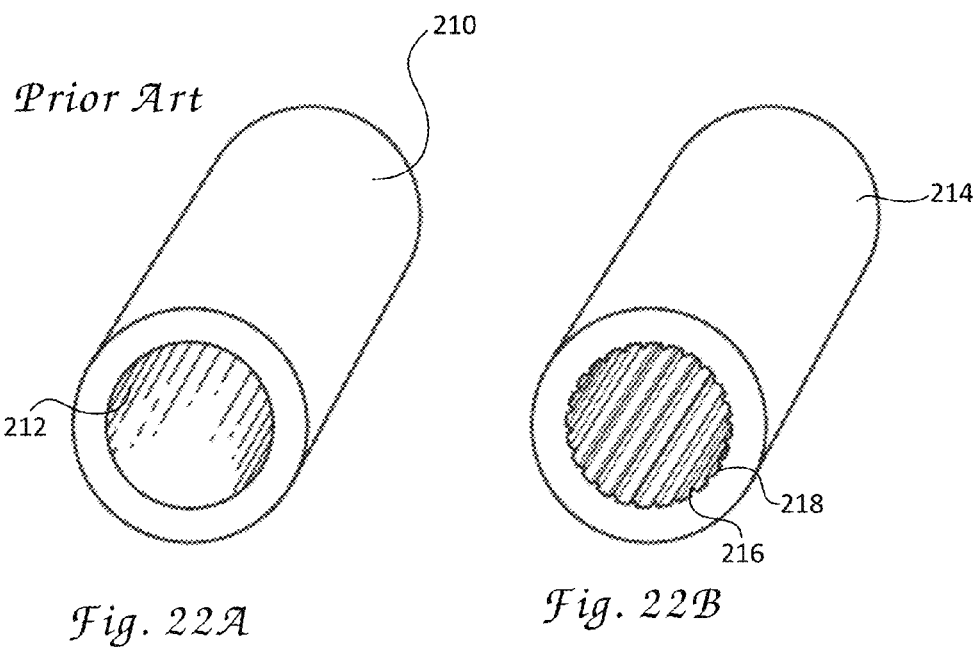
FIG. 22A is a perspective view of the prior art.
FIG. 22B is a perspective view of the resulting extrudate of the invention.
Figures 22C, 22D:
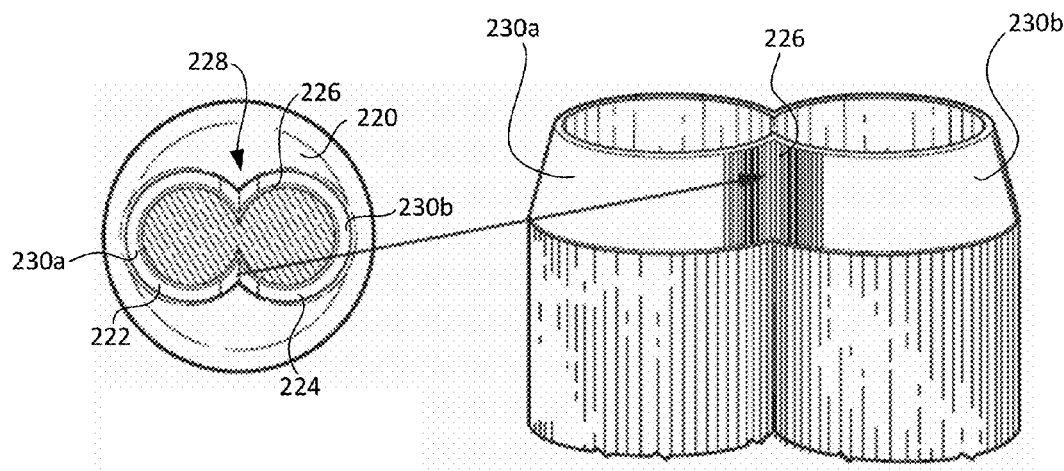
FIG. 22C is a front view of an aspect of the invention.
FIG. 22D is a perspective view of aspects of the invention.
Figure 22E:
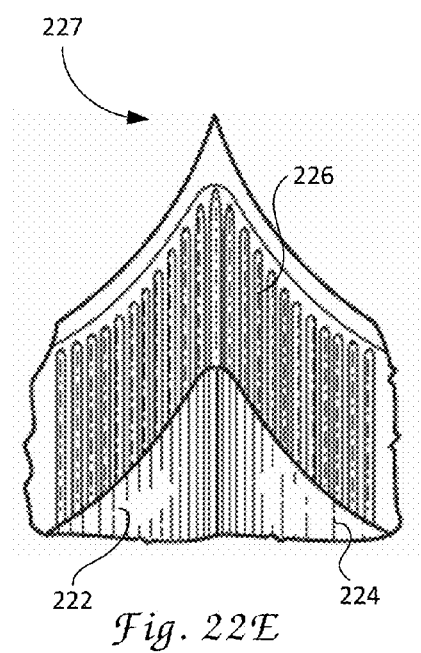
FIG. 22E is a top view of aspects of the invention.

FIG. 22A shows an extrudate 210 manufactured with a mandrel that does not include microstructures. The inner surface 212 is smooth resulting from a mandrel that does not include microstructures. FIG. 22B, however, shows an extrudate 214 having microstructures 216 that are formed on the inner surface 218 by a mandrel which includes microstructures. FIG. 22C shows a mandrel 220 in one embodiment having a first circular portion 222 and a second circular portion 224 that are adjacent to each other. Microstructures 226 are located at the junction 228 between the circular portions. Smooth portion 230a and 230b are located on the respective circular portions as shown in FIG. 22D. FIG. 22E shows the intersection between smooth portions 230a and 230b in one embodiment where the intersection forms a peak 227.

Figure 23:
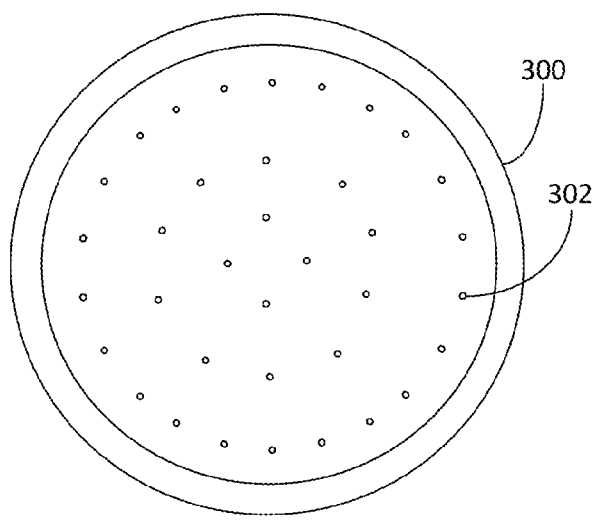
FIG. 23 is a top view of aspects of the invention.
Figure 24:
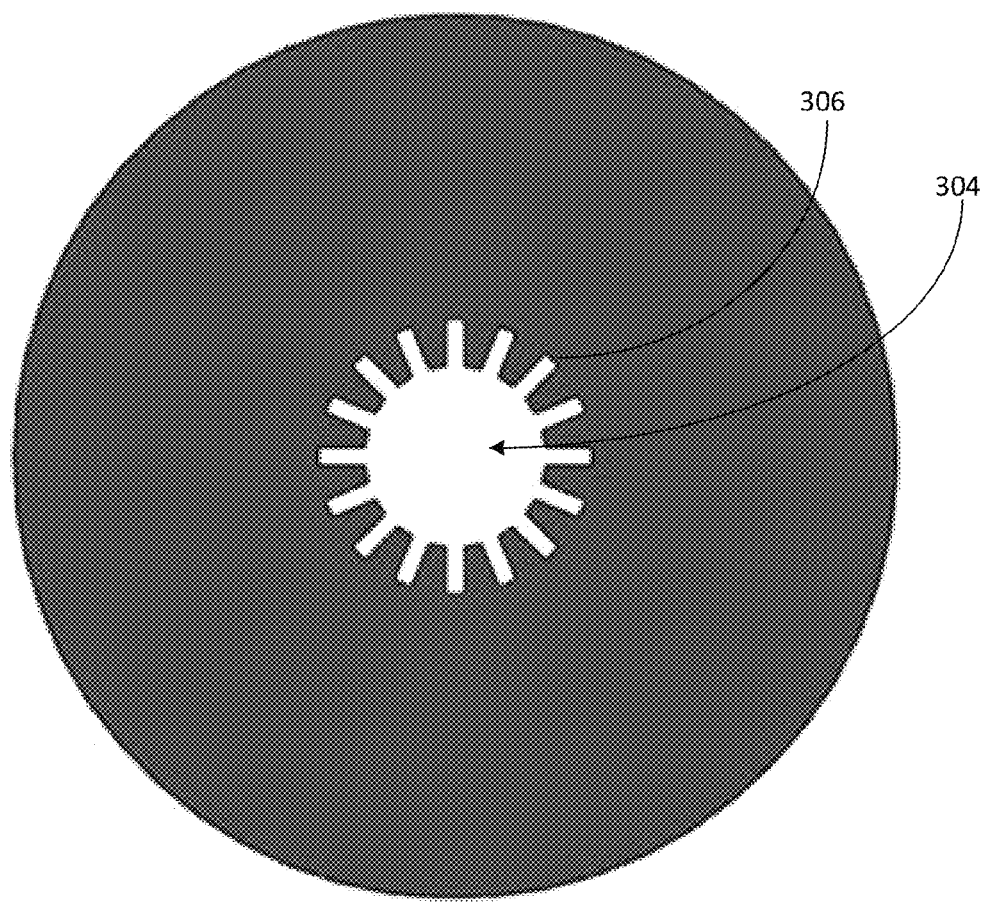
FIG. 24 is a cross section of aspects of the present invention.

Referring to FIG. 23, a spinneret 300 is shown with openings such as 302 that can be used to extrude filaments in melt spinning. The filaments are extruded out the opening and can be woven into a fiber. The fiber can then be drawn which can result in increased strength and orientation. Referring to FIG. 24, an enlarged image of an opening is shown. The opening can include a central bore 304 with radial slots 306. The radial slots are defined in the spinneret and include a width and depth in relation to the bore.

Figure 25A:
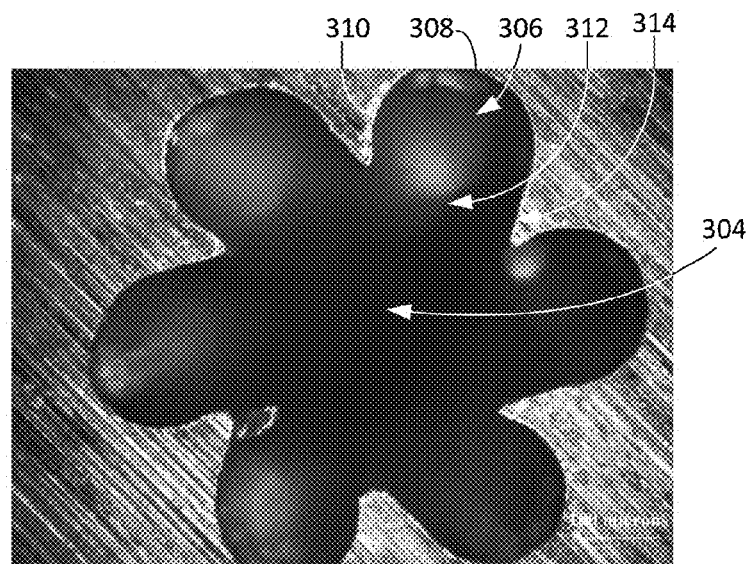
FIGS. 25A and 25B are cross sections of aspects of the present invention.
Figure 25B:
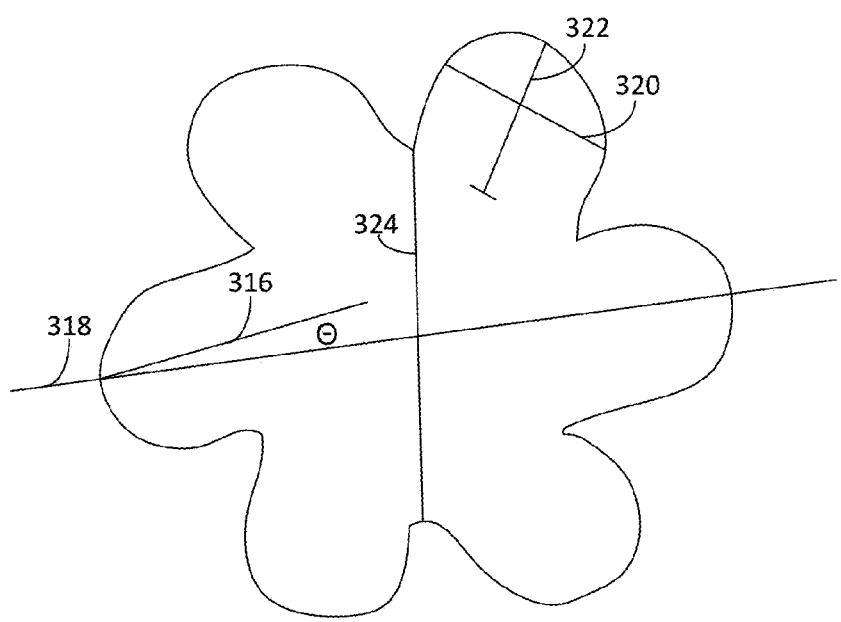

Referring to FIGS. 25A and 25B, an opening in a spinneret is shown having a bore 304 with radial slots 306. The radial slots include an arc 308 located at the distal end of the radial slot. The radial slot can include a concave portion 310 that can extend from the base 312 to the distal end of the radial slot. The radial slot can also include a flat portion 314 that can extend from the base toward the distal end and intersect with the arc. The radial slots can include a center line 316 that define an angle relative to a long axis 318 across the opening intersecting the distal end of the radial slot. Angle Θ can be between 0° and 90°. In one embodiment, Θ is less than 45°. Therefore, the radial slots are arranged in a spiral fashion about the bore. In one embodiment, the width 320 of the radial slot is in the range of 180 µm to 215 µm. The height 322 of the radial slot can be in the range of 170 µm to 180 µm. A short axis 324 can extend from the base of a radial slot across the core to the opposite side and be in the range of 390 µm to 410 µm. In one embodiment, the width of the radial slot is about 187 µm, the height is about 175 µm and the small axis is about 396 µm to 407 µm.

Figure 26:
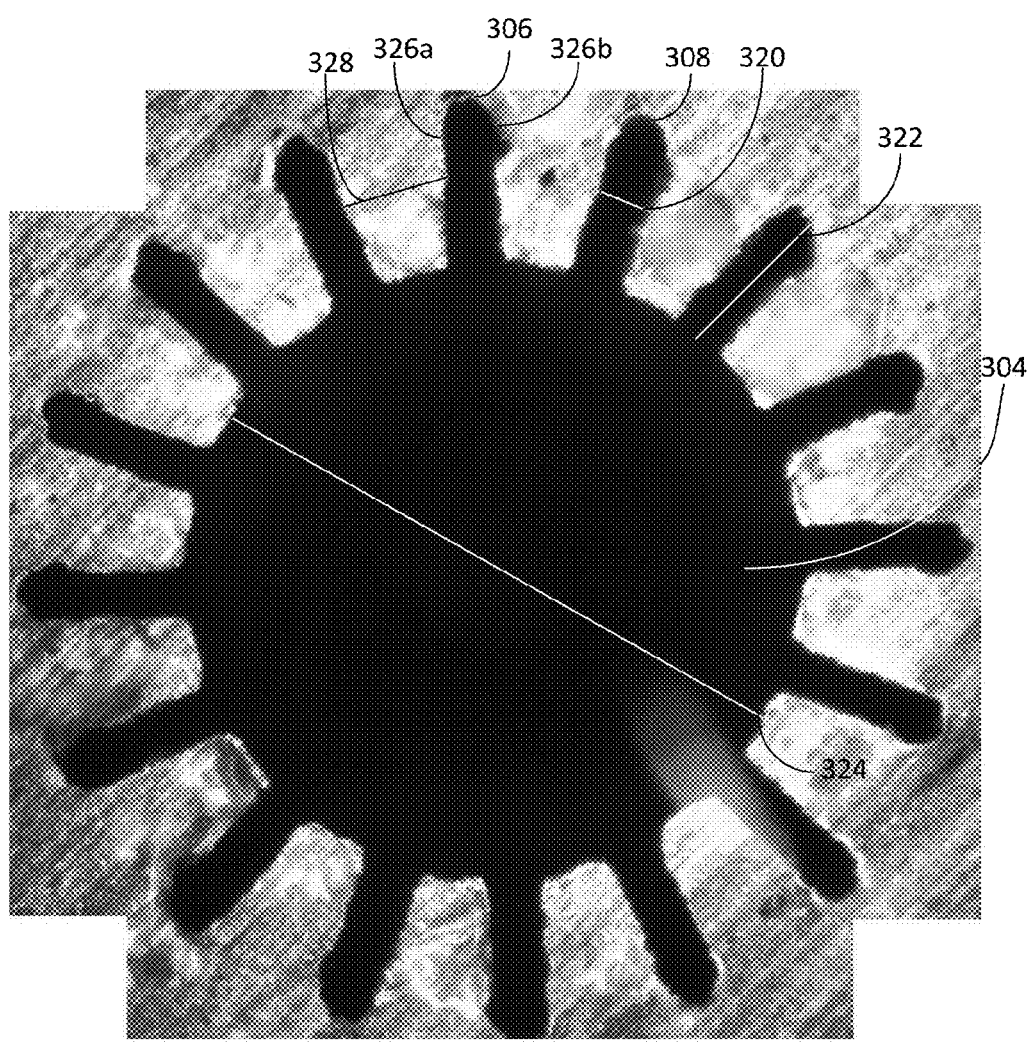
FIG. 26 is a cross section of aspects of the present invention.

Referring to FIG. 26, the opening is shown with the bore in this embodiment, the radial slot 306 can include lateral walls 326a and 326b that extend generally outward from the bore 304. An arc 308 is defined in the spinneret at the distal end of the radial slot. In one embodiment, the width of the radial slot 320 is in the range of 25 µm to 40 µm. The height 322 can be in the range of 90 µm to 100 µm. The distance between the radial slots 328 can be in the range of 50 µm to 60 µm at generally a mid-point of the radial slot. A short axis 324 can be in the range of 340 µm to 380 µm. In one embodiment, the height is about 95 µm, the width is about 28 µm to 36 µm and the distance between radial slots is about 54 µm. In one embodiment, there are 16 radial slots arranged in opposite pairs with each radial slot including an arc portion at it distal end.

Figure 27:
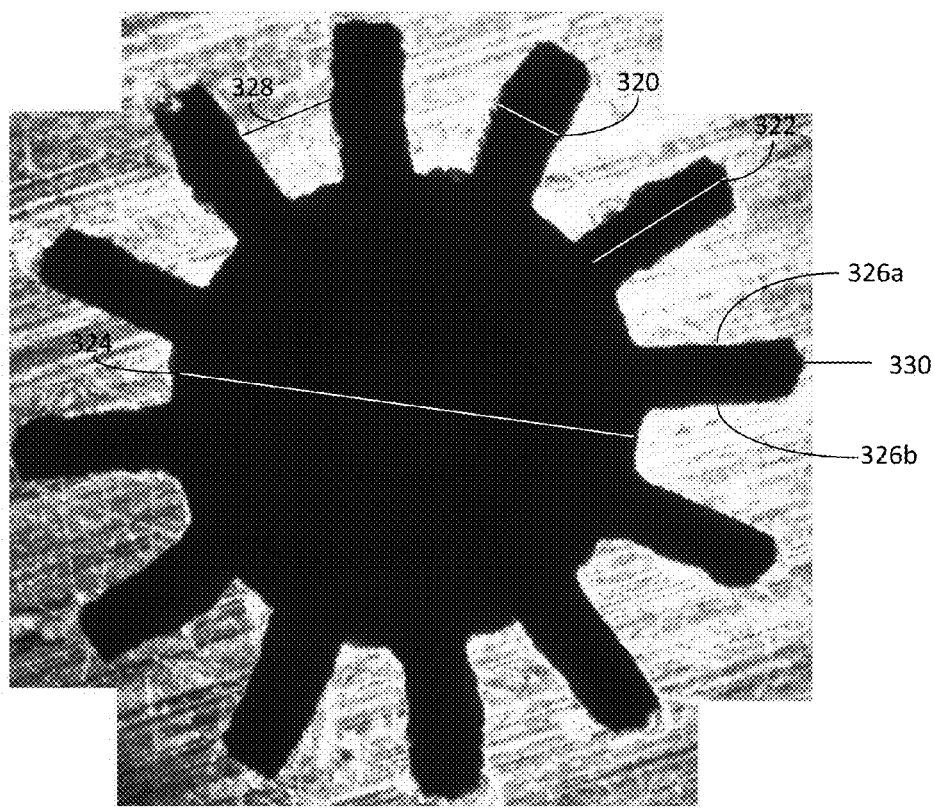
FIG. 27 is a cross section of aspects of the present invention.

Referring to FIG. 27, the opening is shown with radial slots extended away from the bore. The radial slots can include lateral walls 326a and 326b with a capped portion 330 at the distal end of the radial slot. In one embodiment, the capped portion can be flat. The width of the radial slots 320 can be in the range of 40 µm to 60 µm, the height can be in the range of 100 µm to 130 µm, the distance between radial slots 328 can be in the range of 65 µm to 95 µm and the short axis 324 can be in the range of 310 µm to 370 µm. In one embodiment, the width is about 50 µm, the height is about 113 µm, the distance between the radial slots is about 80 µm and the short axis is about 338 µm. In one embodiment there are 12 radial slots arranged in opposite pairs. In one embodiment, the radial slots are offset so that there are no opposite pairs. In one embodiment, the radial slots are of an uneven number so that there is no opposite pairs.

Figure 28:
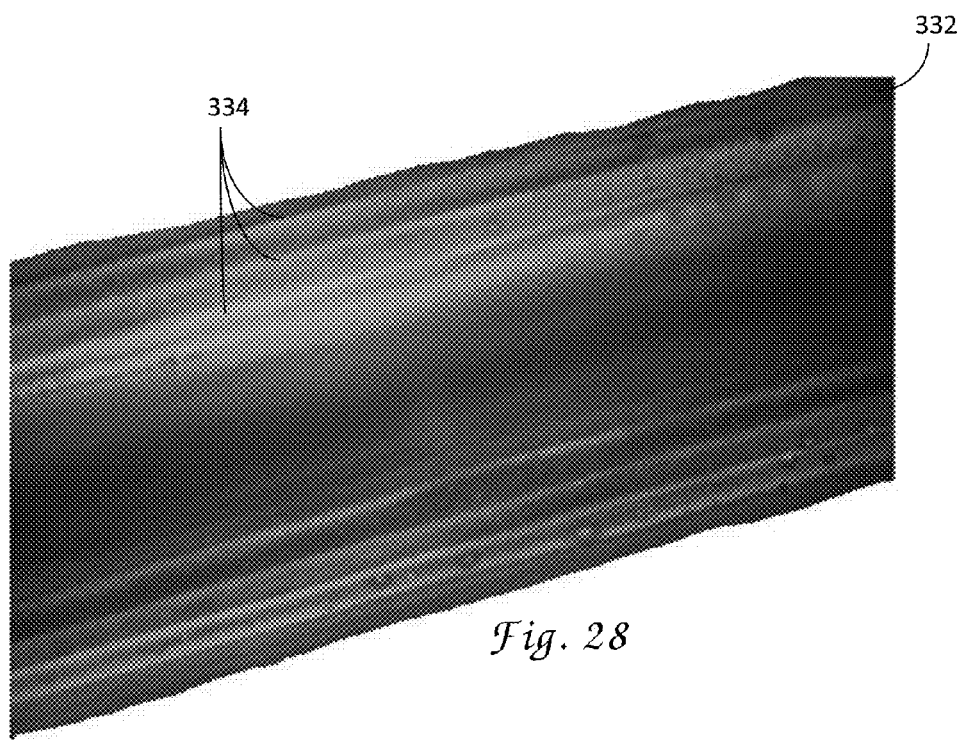
FIG. 28 is a side view of aspects of the present invention.

Referring to FIG. 28, a filament 332 is shown having microstructures 334 disposed on the outer diameter of the filament. The filament is integrated with additional filaments to form a fiber. The microstructures include microfeatures that can have the same physical dimensions and properties as the opening of the spinnerets described herein as the filaments are extruded through the spinnerets in a pre-cooled state.

Figure 29:
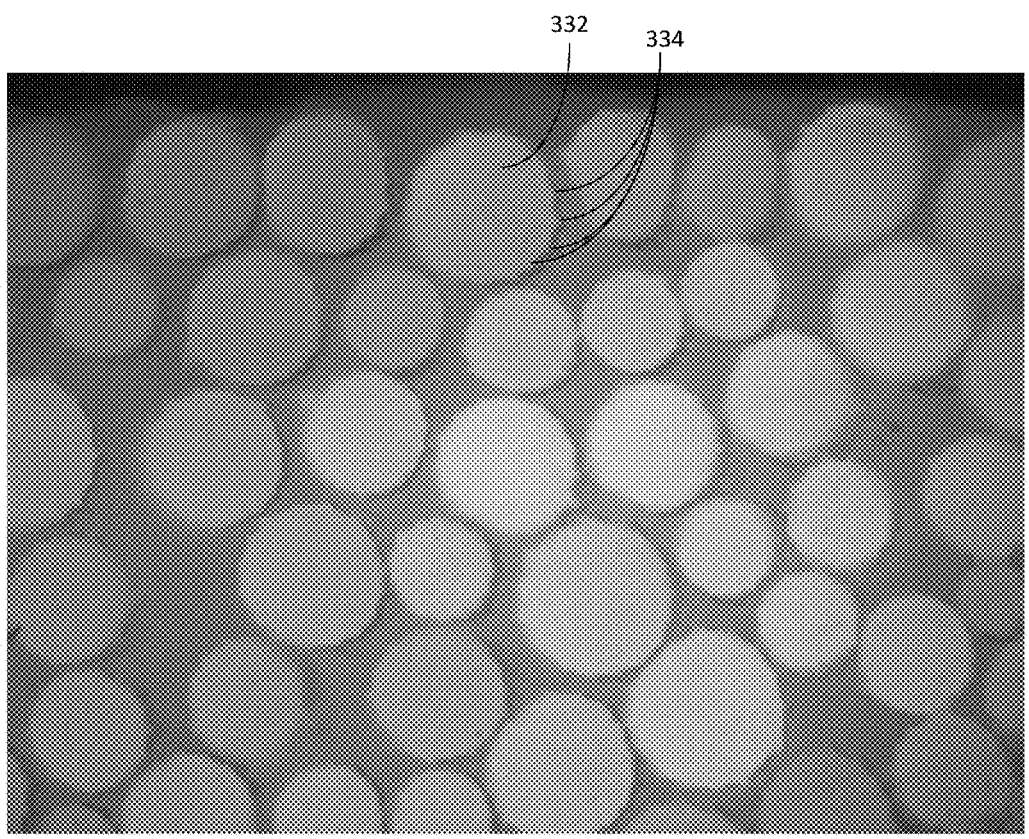
FIG. 29 is cross sections of aspects of the present invention.

Referring to FIG. 29, the cross sections of several extruded filaments having varying diameters are shown. The filament 332 is shown with microstructures 334 at the perimeter.

Figure 30A:
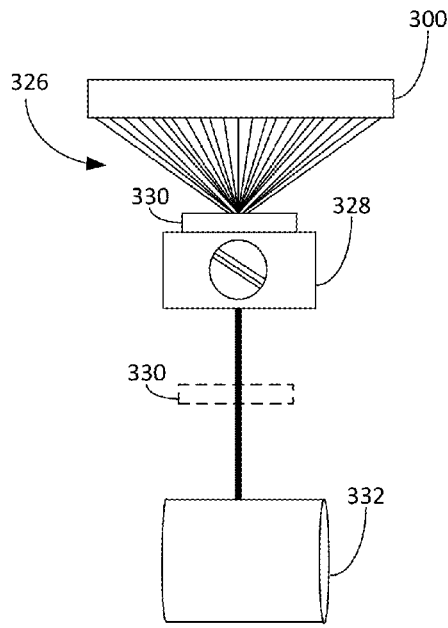
FIGS. 30A and 30B are side views of aspects of the present invention; and,
FIG. 31 is a side view of aspects of the present invention.
Figure 30B:
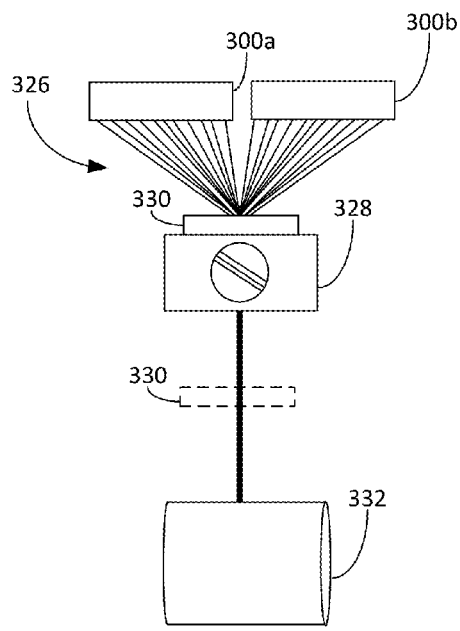

Referring to FIGS. 30A and 30B, one embodiment is shown where in the spinneret 300 has filaments 326 being gathered and receive in binder 328. A cooling unit 330 that can be a quench bath or air cooling unit that can be placed before or after the binder. The filaments, once joined into a fiber at the binder, can be received by a roller 332 where the fiber can be drawn or overdrawn.

Figure 31:
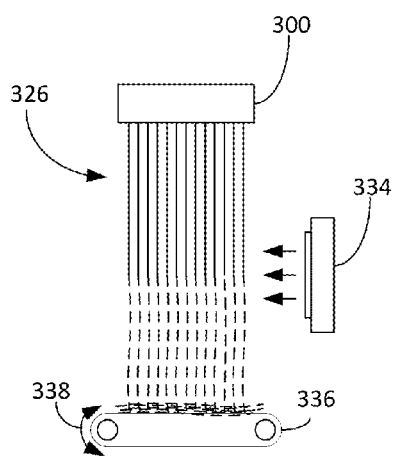

Referring to FIG. 31, the spinneret 300 can extrude filaments 306 in a path that is intersected by a cutting source or entangling source 334, that can blow air of other fluids into the filaments and cause the filaments to be engaged into a fiber, or can actually cut the filaments so that the filaments can be deposited onto a gathering surface 336 to form a mat like structure of microstructures filaments or fibers. In one embodiments the gathering surface can move in a direction shown as 338 to asset with an even disbursement of the filaments or fibers into a mat like structure.

In one embodiment of the invention, the extrudate from the spinneret is rapidly cooled through a quench bath or air cooled. The extrudate can be immediately placed in a water bath from the spinneret. The fibers can be finish free or can include Lurol PP-912T applied with a kiss roller. The spinneret can include between 100 and 1000 orifices. Fiber diameters can be between 26 µm and 34 µm in one embodiment. Testing produced fibers having the diameters taken from the group consisting of: 27.77, 28.45, 29.67, 30.99, 31.42, 31.52 and 33.15 µm. The fibers can have microstructures that are separated around the diameter of the fiber that include 1.191, 1.109, 1.195, 1.022 and 1.207 µm so that the microfeatures to the fiber diameter have a ratio between 1:25 and 1:28. In one embodiment, the microfeatures can be arranged in a sinusoid pattern having features in the range of 0.8 to 1.4 µm on a fiber with a diameter of about 30 µm.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

What is claimed is:

1. A fiber having microstructures comprising:
a plurality of filaments extruded through a die having a pre-cooled state and pre-cooled microstructures;
a plurality of pre-cooled microfeatures included in the pre-cooled microstructure each having a width in the range of 25 µm to 40 µm, height in the range of 90 µm to 100 µm and distance between the microfeatures in the range of 50 µm to 60 µm and a short axis in the range of 340 µm to 380 µm; and,
wherein at least one filament has a post-cooled state having post-cooled microfeatures having physical dimensions smaller than that of the pre-cooled microfeatures.

2. The filament of claim 1 including an arc portion disposed at a distal end of the post-cooled microfeatures.

3. The filament of claim 2 including concave portions disposed between a base and the distal end of the post-cooled microstructures.

4. The filament of claim 1 includes a first arc disposed at a distal end of a die channel included in the die to produce the pre-cooled microstructure on the filament.

5. The filament of claim 4 including a second arc disposed at the distal end of the die channel included in the die to produce the pre-cooled microstructure on the filament.

6. The filament of claim 5 wherein the first arc is adjacent to the second arc.

7. The filament of claim 1 wherein the filament has generally a circular cross section.

8. The filament of claim 1 wherein the post-cooled microfeatures are arranged about the filament in opposite pairs.

9. The filament of claim 1 wherein the post-cooled microfeatures include a center line that defines an angle Θ relative to a long axis in the range of 0° to 90°.

10. The filament of claim 9 wherein the angle θ is in the range of 0° and 45°.

11. A filament having microstructures comprising:
a filament extruded through a die having a pre-cooled state and a pre-cooled microstructure;
a plurality of microfeatures included in the pre-cooled microstructure in a radial spiral arrangement about a center that extends through each filament wherein the microfeatures each have a width in the range of 180 µm to 215 µm, height in the range of 170 µm to 180 µm, and short axis in the range of 390 µm to 410; and,
the filament includes a post-cooled state having post-cooled microfeatures having physical dimensions smaller than that of the pre-cooled microfeatures wherein the post-cooled microfeatures include a center line that defines an angle Θ relative to a long axis that is less than 45°.

12. The filament of claim 11 wherein the post-cooled microfeatures are arranged in opposite pairs and have a distance between post-cooled microfeatures in the range of 50 µm to 60 µm.

13. The filament of claim 11 having a number of microfeatures greater than 6.

14. The filament of claim 13 having a number of microfeatures less than 23.

15. The filament of claim 11 having a capped portion disposed at a distal end of the microfeature.

16. The filament of claim 15 wherein the capped portion is general flat.

17. The filament of claim 15 wherein the capped portion includes an arc.

18. The filament of claim 11 including a fiber comprised of a plurality of filaments wherein the fiber is gathered on a take-up roller so that filaments of a pre-gathered fiber have larger physical dimensions than that of a post-gathered fiber.

19. The filament of claim 11 including a fiber comprised of a plurality of filaments wherein the fiber includes physical characteristics selected from the group consisting of: hydrophobicity, self-cleaning, increased hydro-dynamic drag coefficients, decreased or increased aerodynamic drag coefficients, increased friction, reduced friction, optical effects, increased adhesion, decreased adhesion, oleophobicity, tactile effects, anti-blocking and any combination of these.

20. A fiber having microstructures comprising:
a plurality of extruded filaments having pre-cooled microfeatures in a radial spiral arrangement about a center extending though the fiber wherein the pre-cooled microfeatures each have widths in the range of 5 µm to 400 µm and heights in the range of 25 µm to 400 µm;
at least one filament having a post-cooled state having post-cooled microfeatures having physical dimensions smaller than that of the pre-cooled microfeatures wherein the post-cooled microfeatures include a center line that defines an angle Θ relative to a long axis that is less than 45°; and,
wherein at least one filament is extruded through a die having a first arc disposed at a distal end of a die channel included in the die to produce the pre-cooled microstructures on the filament.

21. The filament of claim 20 wherein the pre-cooled microfeatures each have widths in the range of 180 µm to 215 µm and heights in the range of 90 µm to 180 µm.

22. The filament of claim 20 wherein the filament has generally a circular cross-section.

23. The filament of claim 20 including a second arc disposed at the distal end of the die channel included in the die to produce the pre-cooled microstructures.

* * * * *